(12) United States Patent
Kamatani et al.

(10) Patent No.: US 9,373,800 B2
(45) Date of Patent: Jun. 21, 2016

(54) ORGANIC LIGHT EMITTING ELEMENT HAVING LITHIUM—BORON COMPLEX

(71) Applicant: CANON KABUSHIKI KAISHA, Tokyo (JP)

(72) Inventors: Jun Kamatani, Tokyo (JP); Naoki Yamada, Inagi (JP); Tetsuya Kosuge, Yokohama (JP); Hirokazu Miyashita, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/598,816

(22) Filed: Jan. 16, 2015

(65) Prior Publication Data

US 2015/0214483 A1      Jul. 30, 2015

(30) Foreign Application Priority Data

Jan. 29, 2014   (JP) .................. 2014-014541

(51) Int. Cl.
  *H01L 51/00*     (2006.01)
  *H01L 27/32*     (2006.01)
  (Continued)

(52) U.S. Cl.
  CPC .......... *H01L 51/009* (2013.01); *H01L 27/3225* (2013.01); *H01L 27/3232* (2013.01);
  (Continued)

(58) Field of Classification Search
  None
  See application file for complete search history.

(56) References Cited

U.S. PATENT DOCUMENTS

| | | | |
|---|---|---|---|
| 5,925,472 A * | 7/1999 | Hu ........................ | C09K 11/06 313/504 |
| 2007/0042219 A1 * | 2/2007 | Kathirgamanathan .... | C07F 5/02 428/690 |
| 2013/0256673 A1 * | 10/2013 | Nishiyama ........ | H01L 29/78606 257/59 |

FOREIGN PATENT DOCUMENTS

WO       2013/079676 A1     6/2013

OTHER PUBLICATIONS

European Search Report in corresponding application No. 15152281.0 dated Jun. 8, 2015—6 pages.
(Continued)

*Primary Examiner* — Michael Jung
(74) *Attorney, Agent, or Firm* — Fitzpatrick, Cella, Harper & Scinto

(57) ABSTRACT

Provided is an organic light emitting element that can be driven at a low constant voltage, exhibits high luminous efficiency, and has an excellent lifetime characteristic. The organic light emitting element includes: a pair of electrodes; and an organic compound layer arranged between the pair of electrodes, in which a layer to be brought into contact with one of the pair of electrodes in the organic compound layer contains a lithium complex compound represented by the following general formula [1]:

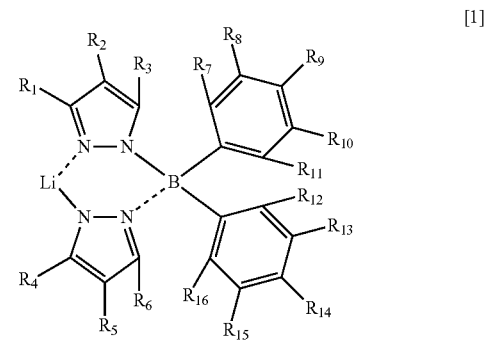

[1]

in the formula [1], $R_1$ to $R_{16}$ each independently represent a hydrogen atom, a halogen atom, a cyano group, an alkyl group that may be substituted with fluorine, an alkoxy group that may be substituted with fluorine, or a substituted or unsubstituted aryl group.

11 Claims, 1 Drawing Sheet

(51) Int. Cl.
H01L 51/52 (2006.01)
H01L 51/50 (2006.01)

(52) U.S. Cl.
CPC .......... *H01L27/3234* (2013.01); *H01L 51/008* (2013.01); *H01L 27/3204* (2013.01); *H01L 51/006* (2013.01); *H01L 51/0054* (2013.01); *H01L 51/0056* (2013.01); *H01L 51/0059* (2013.01); *H01L 51/0072* (2013.01); *H01L 51/5012* (2013.01); *H01L 51/5056* (2013.01); *H01L 51/5072* (2013.01); *H01L 51/5092* (2013.01); *H01L 51/5096* (2013.01); *H01L 51/5206* (2013.01); *H01L 51/5221* (2013.01)

(56) References Cited

OTHER PUBLICATIONS

S. Bieller, et al., "Synthesis and structural characterization of fluorenyltris(pyrozol-1-yl)borate ligands as new examples of cyclopentadienyl/scorpionate hybrid ligands," J. Organometallic Chem., vol. 690, pp. 1935-1946 (2005).

J. L. Kisko, et al., "Phenyl tris(3-tert-butylpyrazolyl)borato complexes of lithium and thallium, [PhTP But ]M (M=Li, Tl): a novel structure for a monomeric tris(pyrazolyl)boratothallium complex and a study of its stereochemical nonrigidity by 1H and 205 Tl NMR spectroscopy," J. Chem. Soc., Dalton Trans., pp. 1929-1935 (1999).

R. Zhang, et al., "Efficient Organic Light-emitting Diode Using Lithium Tetra-(8-hydroxy-quinolinato) Boron as the Electron Injection Layer," Acta Physico-Chimica Sinica, vol. 23, No. 4, pp. 455-458 (2007).

W. J. Layton, et. al., "Syntheses and Reactions of Pyrazaboles", Inorg. Chem., vol. 24, No. 10, pp. 1454-1457 (1985).

S. Trofimenko, "Boron-Pyrazole Chemistry. IV. Carbon- and Boron-Substituted Poly (1-pyrazolyl) borates", J. Am. Chem. Soc., vol. 89, No. 24, pp. 6288-6294 (1967).

* cited by examiner

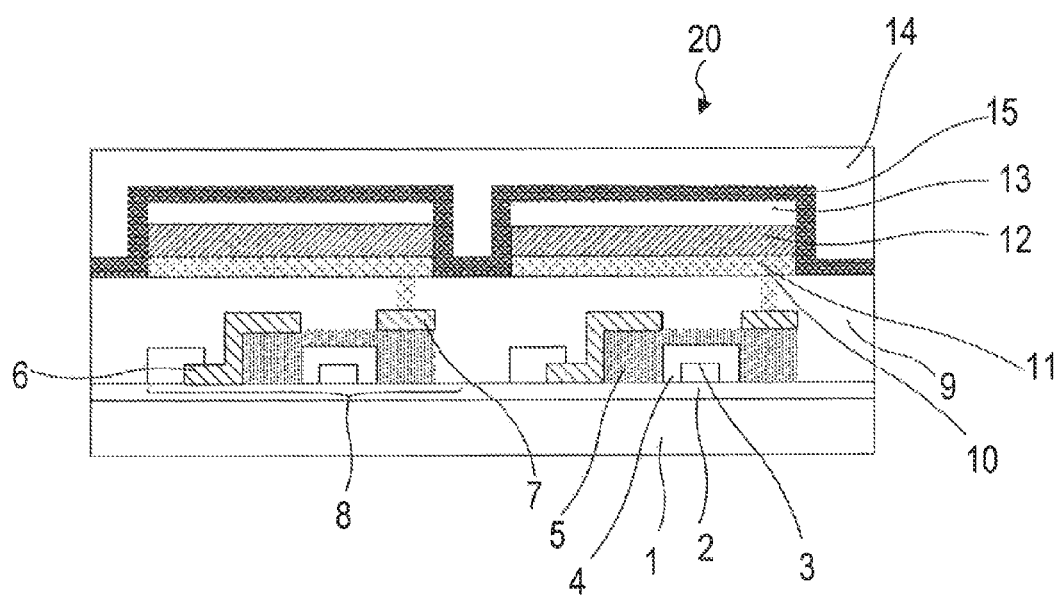

ORGANIC LIGHT EMITTING ELEMENT HAVING LITHIUM—BORON COMPLEX

BACKGROUND OF THE INVENTION

1. Field of the Invention

The present invention relates to an organic light emitting element.

2. Description of the Related Art

An organic light emitting element is an element including an anode, a cathode, and an organic compound layer arranged between the electrodes. A hole and an electron to be injected from the electrodes recombine in a light emitting layer in the organic compound layer to produce an exciton, and the organic light emitting element emits light upon return of the exciton to its ground state. Recent development of the organic light emitting element is significant, and allows the organic light emitting element to be a light emitting device having the following features: a low driving voltage; light emission at various wavelengths; high-speed responsiveness; a small thickness; and a light weight.

In the organic light emitting element, it is important to improve charge injecting property for reducing a voltage of the element. In order to improve the electron injecting property, an inorganic material such as lithium fluoride is generally used, but lithium fluoride is not a suitable material from the viewpoint of a lifetime of the element owing to its hygroscopicity.

As a method of improving electron transport property, there is given, for example, a method involving using a metal salt such as a compound 1-A disclosed in International Publication No. WO2013/079676.

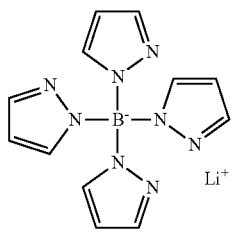

1-A

In addition, in Inorganic Chemistry (1985), 24(10), 1454-7, there is a disclosure of a synthesis example of a compound using potassium, and in Journal of the American Chemical Society (1967), 89(24), 6288-94, there is a disclosure of a synthesis example of a compound using sodium.

As described above, the metal salt such as lithium fluoride to be generally used as an electron injecting material is water-soluble. Use of such compound in a layer of the organic light emitting element causes a reduction in stability of the light emitting element. Also the compound 1-A disclosed in International Publication No. WO2013/079676 is also a water-soluble material, and hence causes a reduction in stability of the light emitting element. In addition, in International Publication No. WO2013/079676, there is only a disclosure of a synthesis example of a metal complex in which three or more pyrazole groups are coordinated, such as the compound 1-A. Further, in International Publication No. WO2013/079676, the compound 1-A is used in an electron transport layer, which is not brought into contact with an electrode of a light emitting element, not in an electron injecting layer, which is brought into contact with the electrode. In addition, the metal complex such as the compound 1-A has low electron transport property, and hence provides an element requiring a high voltage when used alone in a transport layer having a thickness of several tens of nanometers.

In addition, in Inorganic Chemistry (1985), 24(10), 1454-7 and Journal of the American Chemical Society (1967), 89(24), 6288-94, there are not disclosures of any synthesis example of a compound using lithium and use of the compound using potassium and the compound using sodium in the organic light emitting element.

SUMMARY OF THE INVENTION

According to one embodiment of the present invention, there is provided an organic light emitting element, including: a pair of electrodes; and an organic compound layer arranged between the pair of electrodes, in which a layer to be brought into contact with one of the pair of electrodes in the organic compound layer contains a lithium complex compound represented by the following general formula [1].

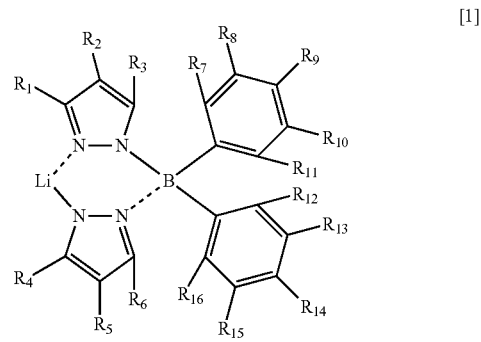

[1]

[In the formula [1], $R_1$ to $R_{16}$ each independently represent a hydrogen atom, a halogen atom, a cyano group, an alkyl group that may be substituted with fluorine, an alkoxy group that may be substituted with fluorine, or a substituted or unsubstituted aryl group.]

Further features of the present invention will become apparent from the following description of exemplary embodiments with reference to the attached drawing.

BRIEF DESCRIPTION OF THE DRAWING

FIGURE is a schematic sectional view illustrating an example of an image display apparatus of the present invention.

DESCRIPTION OF THE EMBODIMENTS

Preferred embodiments of the present invention will now be described in detail in accordance with the accompanying drawing.

According to one embodiment of the present invention, there is provided an organic light emitting element that can be driven at a low constant voltage, exhibits high luminous efficiency, and has an excellent lifetime characteristic based on finding of a water-insoluble charge injecting material.

<Lithium Complex Compound>

A lithium complex compound to be used in the present invention is represented by the following general formula [1].

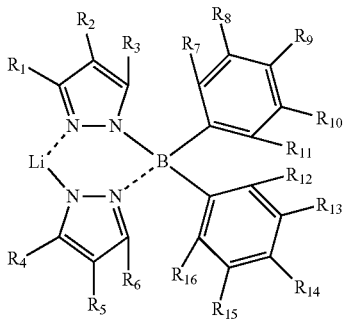

In the formula [1], $R_1$ to $R_{16}$ each independently represent a hydrogen atom, a halogen atom, a cyano group, an alkyl group that may be substituted with fluorine, an alkoxy group that may be substituted with fluorine, or a substituted or unsubstituted aryl group. It is preferred that $R_1$ to $R_6$ each represent a hydrogen atom.

Specific examples of the halogen atom represented by any one of $R_1$ to $R_{16}$ include fluorine atom, chlorine atom, bromine atom, and iodine atom.

The alkyl group represented by any one of $R_1$ to $R_{16}$ is preferably an alkyl group having 1 or more and 6 or less carbon atoms. Specific examples of the alkyl group having 1 or more and 6 or less carbon atoms include a methyl group, an ethyl group, a n-propyl group, an i-propyl group, a n-butyl group, an i-butyl group, a sec-butyl group, a tert-butyl group, a n-pentyl group, an i-pentyl group, a tert-pentyl group, a neopentyl group, a n-hexyl group, and a cyclohexyl group. Of those alkyl groups, a methyl group or a tert-butyl group is more preferred.

Specific examples of the alkoxy group represented by any one of $R_1$ to $R_{16}$ include, but, of course, not limited to, a methoxy group, an ethoxy group, an i-propoxy group, a n-butoxy group, and a tert-butoxy group. Of those alkoxy groups, a methoxy group or an ethoxy group is preferred.

Specific examples of the unsubstituted aryl group represented by any one of $R_1$ to $R_{16}$ include, but, of course, not limited to, a phenyl group, a naphthyl group, a phenanthryl group, an anthryl group, a fluorenyl group, a biphenylenyl group, an acenaphthylenyl group, a chrysenyl group, a pyrenyl group, a triphenylenyl group, a picenyl group, a fluoranthenyl group, a perylenyl group, a naphthacenyl group, a biphenyl group, and a terphenyl group. Of those aryl groups, a phenyl group, a naphthyl group, a fluorenyl group, or a biphenyl group is preferred, and a phenyl group is more preferred.

The aryl group represented by any one of $R_1$ to $R_{16}$ may further have a substituent. In the case where the aryl group further has a substituent, the substituent is not limited, but is preferably a group selected from an alkyl group, a halogen atom, an alkoxy group, a substituted amino group, a cyano group, a trifluoromethyl group, and an aryl group.

In the case where the substituent that the aryl group further has is an alkyl group, specific examples of the alkyl group are the same as the specific examples of the alkyl group represented by any one of $R_1$ to $R_{16}$. The aryl group is preferably an alkyl group having 1 or more and 6 or less carbon atoms, more preferably a methyl group or a tert-butyl group.

In the case where the substituent that the aryl group further has is a halogen atom, specific examples of the halogen atom are the same as the specific examples of the halogen atom represented by any one of $R_1$ to $R_{16}$.

In the case where the substituent that the aryl group further has is an alkoxy group, specific examples of the alkoxy group are the same as the specific examples of the alkoxy group represented by any one of $R_1$ to $R_{16}$.

In the case where the substituent that the aryl group further has is a substituted amino group, specific examples of the substituted amino group include, but, of course, not limited to, an N-methylamino group, an N-ethylamino group, an N,N-dimethylamino group, an N,N-diethylamino group, an N-methyl-N-ethylamino group, an N-benzylamino group, an N-methyl-N-benzylamino group, an N,N-dibenzylamino group, an anilino group, an N,N-diphenylamino group, an N,N-dinaphthylamino group, an N,N-difluorenylamino group, an N-phenyl-N-tolylamino group, an N,N-ditolylamino group, an N-methyl-N-phenylamino group, an N,N-dianisoylamino group, an N-mesityl-N-phenylamino group, an N,N-dimesitylamino group, an N-phenyl-N-(4-tert-butylphenyl)amino group, and an N-phenyl-N-(4-trifluoromethylphenyl)amino group.

In the case where the substituent that the aryl group further has is an aryl group, specific examples of the aryl group are the same as the specific examples of the aryl group represented by any one of $R_1$ to $R_{16}$. The aryl group is preferably a phenyl group, a naphthyl group, a fluorenyl group, or a biphenyl group, more preferably a phenyl group.

<Properties of Lithium Complex Compound>

The lithium complex compound represented by the general formula [1] has improved stability as compared to an alkali metal salt and an alkali metal complex to be generally used in the organic light emitting element. In general, an alkali metal salt and an alkali metal complex have low complex stability, and are hydrated through moisture absorption or ionized in the presence of water. This is because alkali metal ions are hard acids based on the Hard and Soft Acids and Bases theory (HSAB theory) and are sensitive to a reaction with a water ion, which is a hard base. The use of such material reactive to water in an organic electric field element causes dark spot formation during production or driving of the element owing to a water content in the air, and changes in characteristics such as an increased voltage. Therefore, the lithium complex compound represented by the general formula [1] is designed as described below.

1. Metal complex using lithium, which is less reactive to water, of alkali metals having charge injecting property from an electrode
2. Ligand having a structure allowing for stable coordination to lithium
3. Ligand having low water solubility.

Through such designs, a lithium complex compound that is hardly dissolved in water has successfully been found. Thus, a stable organic light emitting element has been able to be produced by using the complex for the light emitting element.

Those designs are described in more detail.

1. Metal Complex Using Lithium, which is Less Reactive to Water, of Alkali Metals Having Charge Injecting Property from an Electrode Of homologous atoms, an atom of a higher atomic number has more shells, and hence has a larger atomic radius. In such atom, an electron becomes unstable owing to an increased distance between the electron and a proton, and its ionization energy is reduced. That is, an atom having a larger atomic radius has lower ionization energy. Therefore, such atom is easily ionized and is highly reactive to water. In addition, alkali metals are highly reactive to water because the alkali metals each include only one electron in its outermost shell and easily become a monovalent cation owing to the outermost electron being easily detached therefrom. Of such highly reactive alkali metals, an atom as less reactive to water as possible is required to be used. Lithium, which has the smallest atomic radius, is the most suitable as an alkali metal of an alkali metal complex to be used in an injecting layer of the light emitting element. It should be noted that the first ionization energies of alkali metals are as follows: Li: 520.2 kJmol$^{-1}$; Na: 495.8 kJmol$^{-1}$; K: 418.8 kJmol$^{-1}$; Rb: 403 kJmol$^{-1}$; and Cs: 375.7 kJmol$^{-1}$.

2. Ligand Having a Structure Allowing for Stable Coordination to Lithium

A lithium atom has an ionic radius of 60 picometers (pm). This is significantly larger than that of carbon, 15 picometers (pm), that of nitrogen, 11 picometers (pm), and that of oxygen, 9 picometers (pm). A ligand to be stably coordinated to a metal having such atomic radius is considered. While lithium has a four-coordinated form, a monovalent bidentate ligand is generally used as its ligand because lithium is monovalent. In this case, the ligand is generally formed of carbon, nitrogen, and oxygen. However, in the case where the ligand forms a five-membered ring with a lithium atom, the five-membered ring includes considerable strain because the lithium atom is large. Also in the case where the ligand forms a six-membered ring, the strain similarly arises, but such case of six-membered ring coordination is considered to be more stable because more strain can be absorbed in a higher-membered ring. In order to further relieve the strain of the ring, an atom, such as boron having a moderately large ionic radius of 20 picometers (pm), is introduced. With this, a more stable ring structure can be achieved and the ligand is stably coordinated to lithium.

3. Ligand Having Low Water Solubility

One factor that increases the affinity for water in a ligand is an unshared electron pair in the ligand. The unshared electron pair may generate a polar portion and cause hydration through coordination to water. As an atom having an unshared electron pair, there are given a nitrogen atom and an oxygen atom. For example, benzene and naphthalene are not dissolved in water, but pyridine, pyrazole, and imidazole are dissolved in water. In view of the foregoing, in the case of using a ligand such as pyridine, pyrazole, or imidazole, all the unshared electron pairs in the ligand are used for coordination bonds, to allow for a state of having no unshared electron pairs in the complex state. With this, a less water-soluble complex can be produced. It should be noted that there exists an atom having an unshared electron pair but low affinity for water, such as a fluorine atom, and an oxygen atom in an ether group or a phenoxy group.

As a result of diligent studies on a material satisfying the above-mentioned conditions, the lithium complex compound represented by the general formula [1] has been found.

The lithium complex compound represented by the general formula [1] is a metal complex using lithium metal. Its ring structure including the metal is formed of a six-membered ring and includes a boron atom in the ring with a view to stabilizing the bonding. In addition, the ligand is formed of boron, pyrazole groups, and phenyl groups. In the ligand, all the unshared electron pairs in the pyrazole groups are used for coordination bonds to boron and lithium. The phenyl groups are used as substituents of boron not in association with lithium, and contribute to an improvement in hydrophobicity.

<Exemplification of Lithium Complex Compound>

Specific structures of the lithium complex compound represented by the general formula [1] are exemplified below.

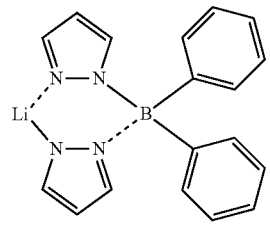

A1

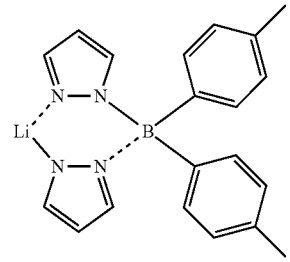

A2

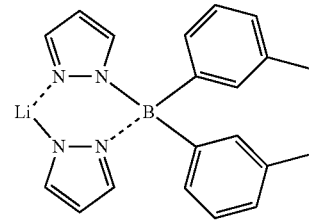

A3

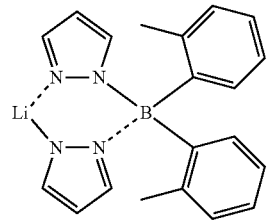

A4

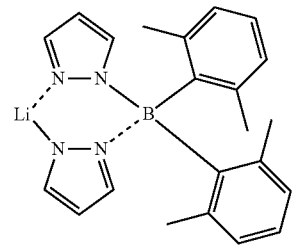

A5

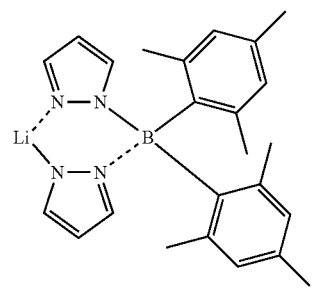

A6

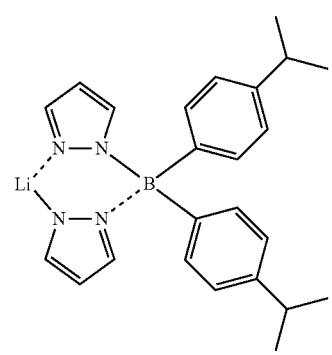
A7
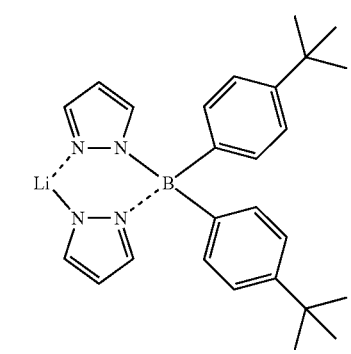
A8
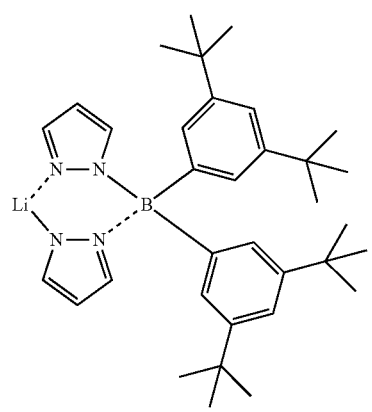
A9
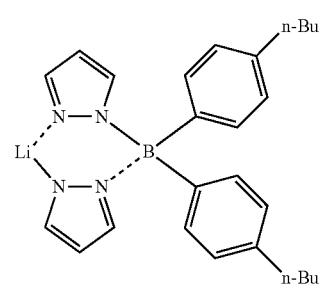
A10
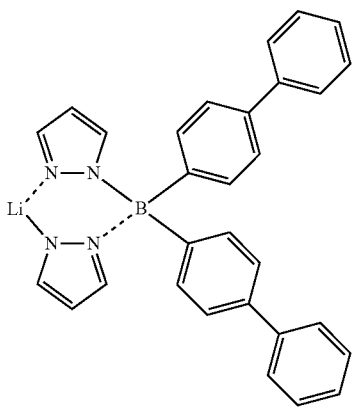
A11
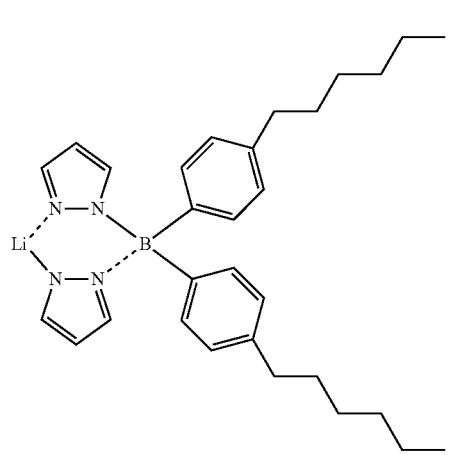
A12
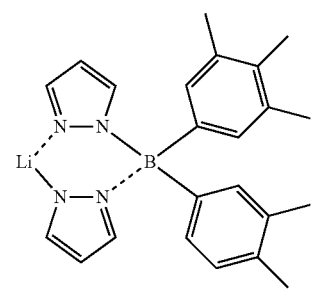
A13
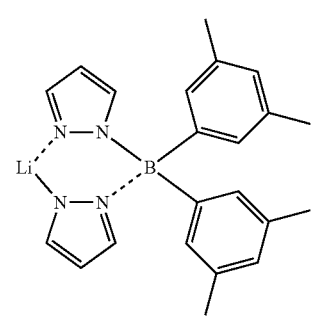
A14

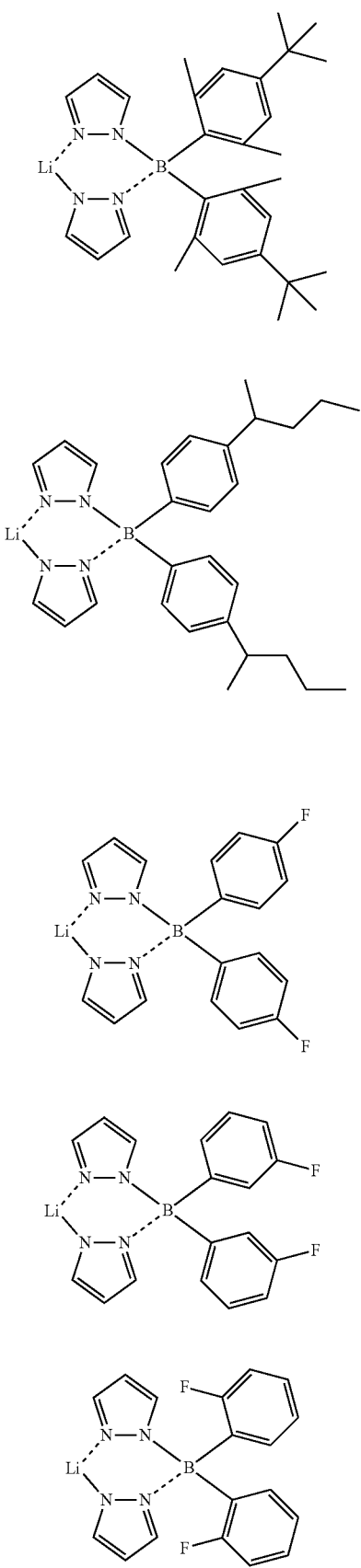

A25 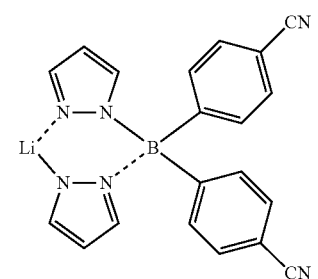

A26 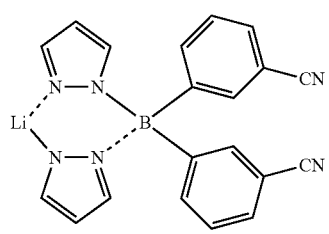

A27 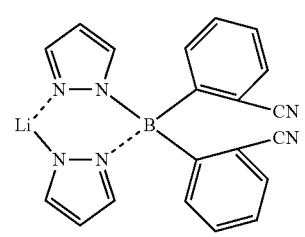

A28 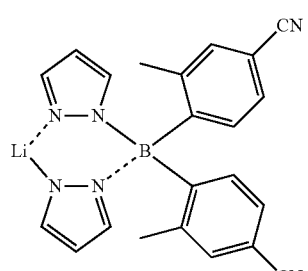

A29 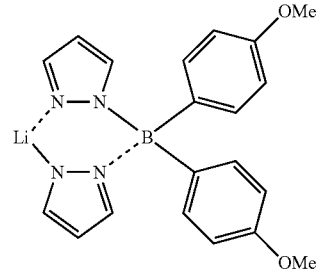

A30 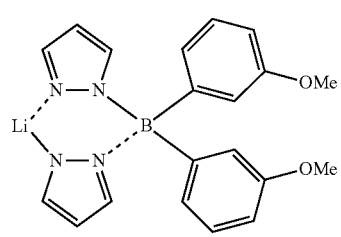

A31 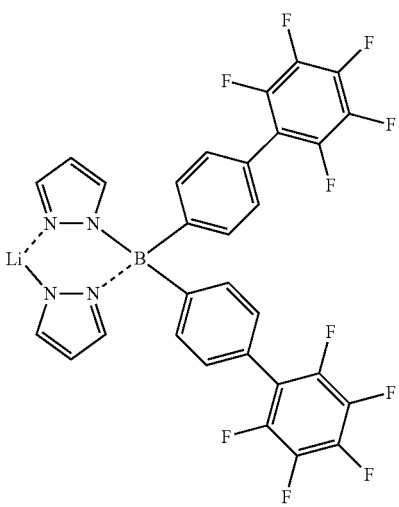

A32 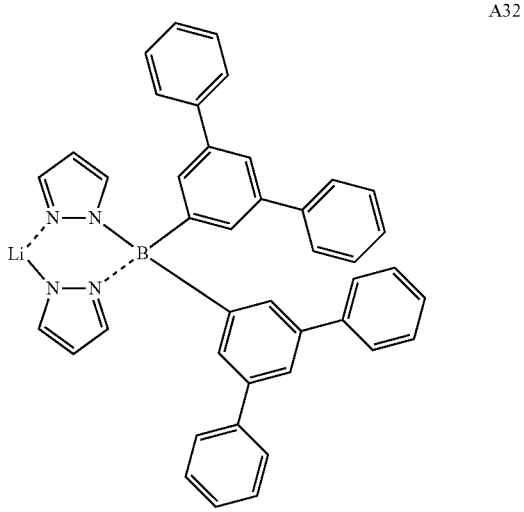

The compounds represented as the group A are compounds in which $R_1$ to $R_6$ each represent a hydrogen atom and the phenyl group has a substituent. Such compounds are preferred because its phenyl group is not bonded to lithium having low ionization energy, and hence the bonding is not destabilized owing to steric hindrance even when a substituent is introduced. The substituent is introduced with a view to reducing an intermolecular interaction so as to improve sublimation property of the lithium complex compound upon its use by vapor deposition, and strengthening the bonding. In actuality, the sublimation temperature can be reduced by introducing a fluorine group or the like. In addition, an electric field element to be produced can be prevented from being crystallized by introducing a substituent to achieve lower crystallinity.

B1 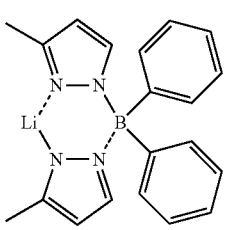

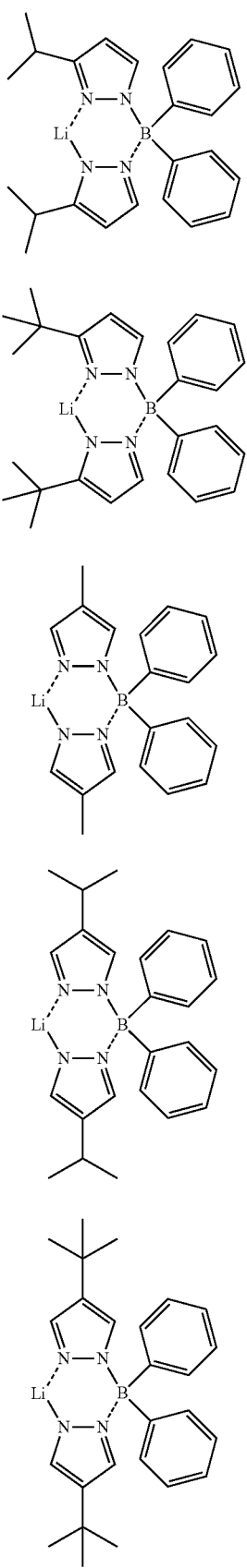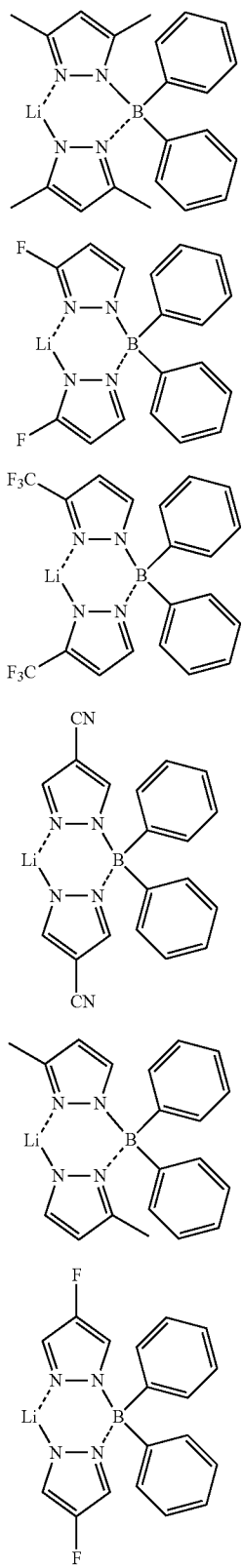
The compounds represented as the group B are compounds in which $R_7$ to $R_{16}$ each represent a hydrogen atom and the pyrazole group has a substituent. When a substituent is introduced into a pyrazole group bonded to lithium, there may arise a compound having an unstable bonding owing to steric hindrance and not suitable for use by vapor deposition. However, when the lithium metal is surrounded by substituents, the stability to water can be expected to be improved. In addition, an electric field element to be produced can be prevented from being crystallized by introducing a substituent to achieve lower crystallinity.

C1
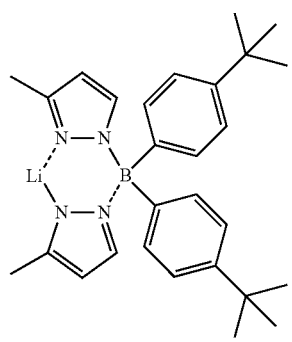

C2
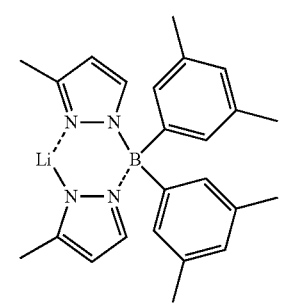

C3
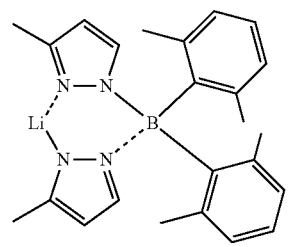

C4
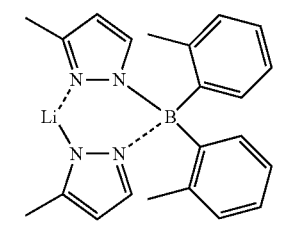

C5
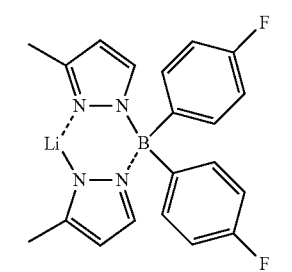

-continued

C6
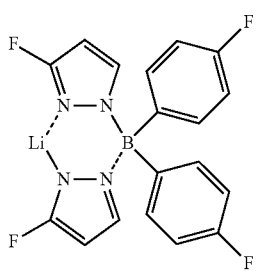

C7
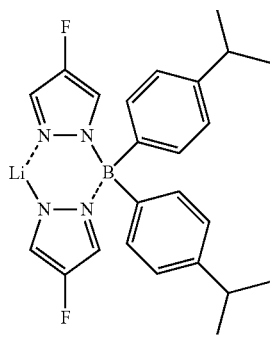

C8
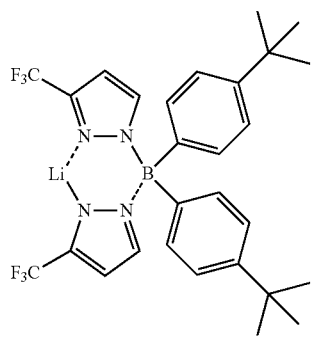

C9
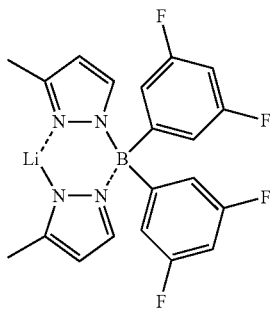

C10
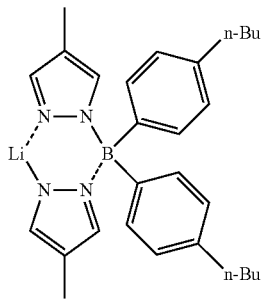

C11

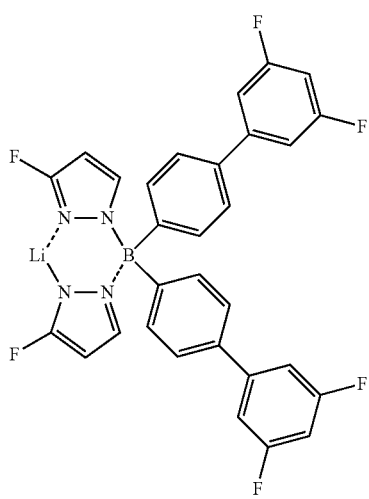

C12

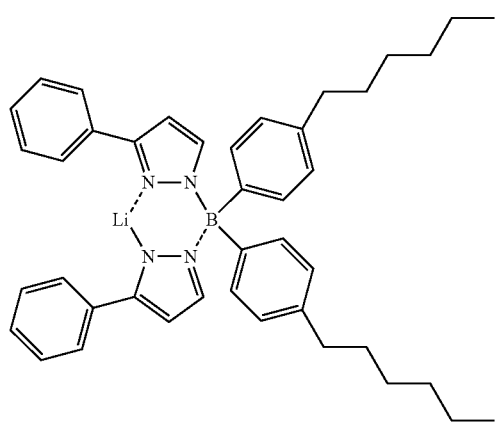

The compounds represented as the group C are compounds in which both the pyrazole group and the phenyl group have a substituent. When a substituent is introduced into a pyrazole group bonded to lithium, there may arise a compound having an unstable bonding owing to steric hindrance and not suitable for use by vapor deposition. However, when the lithium metal is surrounded by substituents, the stability to water can be expected to be improved. An electric field element to be produced by application can be prevented from being crystallized by introducing a substituent into both of the pyrazole group and the phenyl group to achieve lower crystallinity.

<Synthesis Method for Lithium Complex Compound>

The lithium complex compound represented by the general formula [1] is synthesized according to, for example, the following reaction scheme.

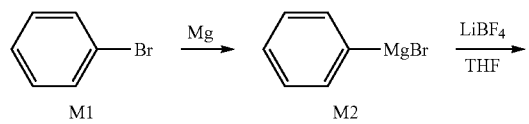

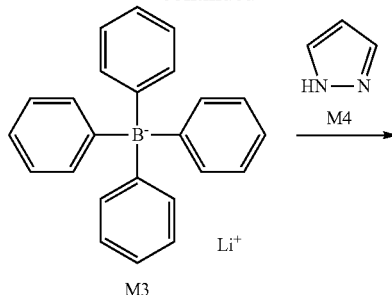

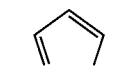

In addition, it has been found that various lithium complex compounds can be produced by introducing substituents represented by $R_1$ to $R_{16}$ into bromobenzene (M1) and/or pyrazole (M4). It should be noted that the lithium complex compound can also be synthesized from M2 when M2 is sold as a reagent.

<Organic Light Emitting Element>

The organic light emitting element of the present invention includes at least: an anode and a cathode as a pair of electrodes; and an organic compound layer arranged between the pair of electrodes.

In the organic light emitting element of the present invention, the organic compound layer may be a single layer or a laminate formed of a plurality of layers, as long as the layer includes a light emitting layer. Herein, in the case where the organic compound layer is a laminate formed of a plurality of layers, the organic compound layer may include, in addition to the light emitting layer, a hole injecting layer, a hole transport layer, an electron blocking layer, a hole/exciton blocking layer (hole blocking layer), an electron transport layer, an electron injecting layer, or the like. As a specific element construction, the following constructions are given. It should be noted that, in the organic compound layer, the light emitting layer is a layer containing a light emitting material.

(1) Anode/light emitting layer/cathode
(2) Anode/hole transport layer/light emitting layer/electron transport layer/cathode
(3) Anode/hole transport layer/light emitting layer/electron transport layer/electron injecting layer/cathode
(4) Anode/hole injecting layer/hole transport layer/light emitting layer/electron transport layer/cathode
(5) Anode/hole injecting layer/hole transport layer/light emitting layer/electron transport layer/electron injecting layer/cathode
(6) Anode/hole transport layer/electron blocking layer/light emitting layer/hole blocking layer/electron transport layer/cathode
(7) Anode/hole transport layer/electron blocking layer/light emitting layer/hole blocking layer/electron transport layer/electron injecting layer/cathode Of those element constructions, the constructions (6) and (7), each of which includes both the electron blocking layer and the hole blocking layer, are preferably used. The constructions (6) and (7) can provide a light emitting element that does not cause any carrier leakage and has high luminous efficiency because both carriers, i.e., a hole and an electron can be trapped in the light emitting layer.

It should be noted that those element construction examples are only very basic element constructions and the element construction of the organic light emitting element of the present invention is not limited thereto. For example, the following various layer constructions can each be adopted: an insulating layer is formed at an interface between an electrode and the organic compound layer, an adhesion layer or an interference layer is formed, the electron transport layer or the hole transport layer is constructed of two layers having different ionization potentials, or the light emitting layer is constructed of two layers including different light emitting materials.

In the organic light emitting element of the present invention, there may be adopted the so-called bottom emission system in which the light is extracted from an electrode on a side closer to the substrate or the so-called top emission system in which the light is extracted from a side opposite to the substrate. In addition, the construction of a double-face extraction may be adopted.

The organic light emitting element of the present invention contains the lithium complex compound represented by the general formula [1] in a layer to be brought into contact with one of the pair of electrodes in the organic compound layer. When the lithium complex compound represented by the general formula [1] is contained in a layer to be brought into contact with one of the pair of electrodes, charge injection is promoted. As a result of various studies, the inventors of the present invention have found that such use of the lithium complex compound represented by the general formula [1] in a layer to be brought into contact with one of the pair of electrodes can provide an element exhibiting light output of high luminance at a low voltage with high efficiency and having extremely high durability.

Herein, examples of the layer to be brought into contact with one of the pair of electrodes include the hole injecting layer, the hole transport layer, the electron injecting layer, and the electron transport layer. The layer to be brought into contact with one of the pair of electrodes is preferably a layer to be brought into contact with a cathode. The layer to be brought into contact with a cathode is preferably the electron injecting layer or the electron transport layer. In addition, it is preferred that the layer to be brought into contact with one of the pair of electrodes be prevented from being brought into contact with the light emitting layer in the organic compound layer, because the lithium complex compound represented by the general formula [1] is not in danger of degrading an excited molecule in the light emitting layer and causing a reduction in element performance.

The layer to be brought into contact with one of the pair of electrodes, in particular, the electron injecting layer may be a layer formed only of the lithium complex compound represented by the general formula [1], but is preferably a layer formed of the lithium complex compound represented by the general formula [1] and another compound.

Herein, in the case where the layer to be brought into contact with one of the pair of electrodes is a layer formed of the lithium complex compound represented by the general formula [1] and another compound, the concentration of the lithium complex compound represented by the general formula [1] only needs to be equal to or more than a concentration sufficient for charge injection from an electrode, particularly for electron injection. On this point, a higher concentration seems to be preferred. However, on the other hand, the charge transport property of the lithium complex compound represented by the general formula [1] is not so high, and hence the other compound to be mixed is required to play a role of charge transport. Therefore, the concentration of the other compound to be mixed is preferably as high as possible as long as sufficient injecting property is achieved. Consequently, the mixed ratio between the lithium complex compound represented by the general formula [1] and the other compound is preferably from 100:0 to 10:90, more preferably from 20:80 to 60:40, in terms of a weight ratio. A mixed ratio within the above-mentioned range is preferred because the charge injecting property and the charge transport property, in particular the electron injecting property and the electron transport property, are well balanced and the voltage can be reduced.

It should be noted that the lithium complex compound represented by the general formula [1] may be used as a constituent material for a layer other than the layer to be brought into contact with one of the pair of electrodes, such as the electron transport layer, the electron injecting layer, the hole transport layer, the hole injecting layer, and the hole blocking layer.

The light emitting layer may be formed of a single layer or a plurality of layers. The light emitting layer may have a mixed color by including a light emitting material exhibiting two or more kinds of emission colors. The term "plurality of layers" means a state in which a light emitting layer and another light emitting layer are laminated. In this case, the emission color of the organic light emitting element ranges from blue to green or to red, but is not particularly limited.

More specifically, the emission color may be a white color or a medium color. In the case of a white color, the light emitting layer emits a red color, a blue color, or a green color. In addition, the light emitting layer is formed by a film forming method such as vapor deposition or application.

The organic light emitting element of the present invention may include a light emitting portion in the organic compound layer, and the light emitting portion may contain a plurality of light emitting materials. Of the plurality of light emitting materials, any two materials are light emitting materials emitting colors different from each other, and the element including those materials may be an element emitting a white color.

In addition, the light emitting layer may be formed of a plurality kinds of components, and those components can be divided into a main component and a sub-component. The main component is a compound having the largest weight ratio of all the compounds serving as constituents of the light emitting layer, and can be called a host material. The sub-component is a compound other than the main component. The sub-component can be called a guest (dopant) material, a light emission assist material, or a charge injecting material. The light emission assist material and the charge injecting material may be organic compounds having structures identical to or different from each other. Those materials each serve as the sub-component, but may each be called a host material 2 for discrimination from the guest material.

Herein, the guest material is a compound responsible for main light emission in the light emitting layer. In contrast, the host material is a compound present as a matrix around the guest material in the light emitting layer and mainly responsible for carrier transport and excitation energy donation to the guest material.

The concentration of the guest material is 0.01 wt % or more and less than 50 wt %, preferably 0.1 wt % or more and 20 wt % or less, with respect to the total amount of the constituent materials of the light emitting layer. The concentration of the guest material is more preferably 10 wt % or less in order to prevent concentration quenching. In addition, the guest material may be contained uniformly in the entire layer containing the host material, contained with a concentration gradient in the layer, or contained partially in a specific region to form a region free of the guest material in the host material layer.

Herein, a heretofore known compound other than the lithium complex compound represented by the general formula [1] may be used together with the lithium complex compound as required. Specific examples of such compound include a low-molecular or high-molecular light emitting material, a hole injectable compound, or a hole transportable compound, a compound to serve as the host of the light emitting layer, a light emitting compound, an electron injectable compound and an electron transportable compound. Examples of those compounds are shown below.

The hole injectable/transportable material is preferably a material having a high hole mobility so that the injection of a hole from the anode may be facilitated and the injected hole can be transported to the light emitting layer. In addition, the material is preferably a material having a high glass transition point for preventing the deterioration of film quality such as crystallization in the organic light emitting element. Examples of the low-molecular and high-molecular materials each having hole injecting/transport performance include a triarylamine derivative, an arylcarbazole derivative, a phenylenediamine derivative, a stilbene derivative, a phthalocyanine derivative, a porphyrin derivative, poly(vinyl carbazole), poly(thiophene), and other conductive polymers. Further, the hole injectable/transportable material is suitably used for the electron blocking layer as well. Specific examples of a compound to be used as the hole injectable/transportable material are shown below. However, the compound is of course not limited thereto.

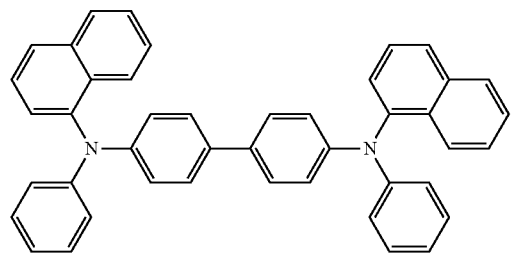

HT1

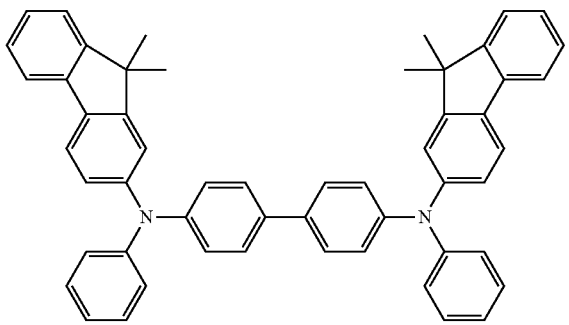

HT2

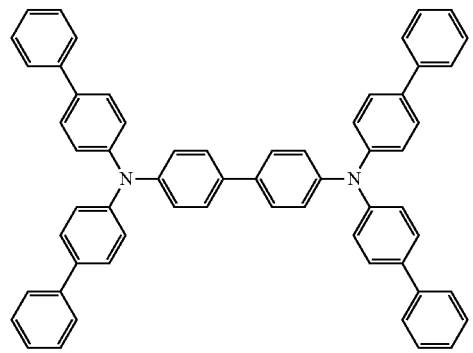

HT3

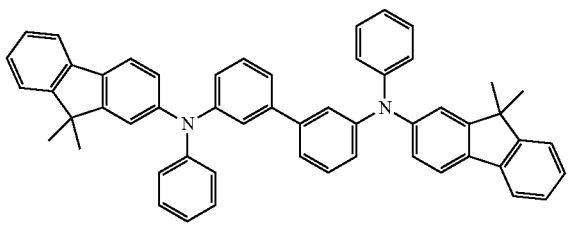

HT4

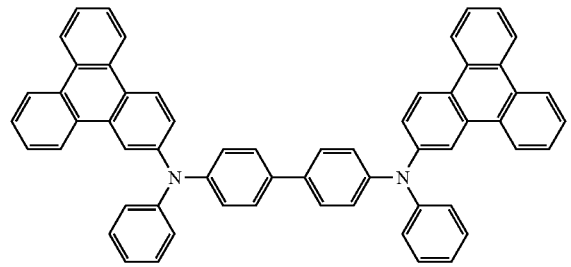

HT5

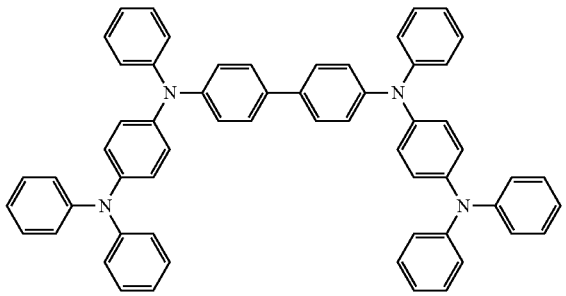

HT6

-continued
HT7
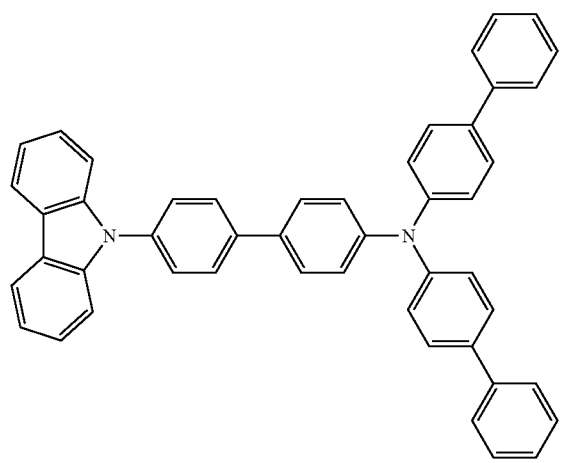
HT8
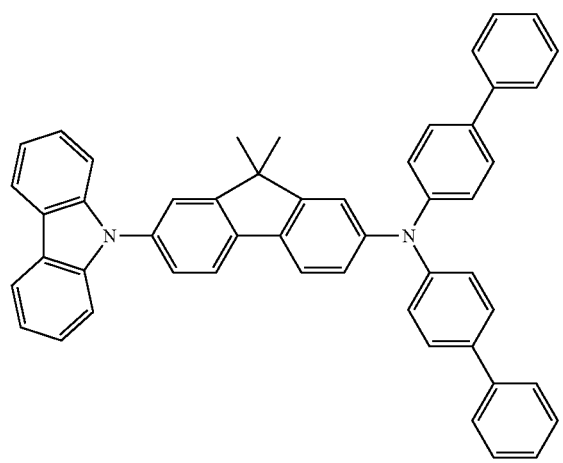
HT9
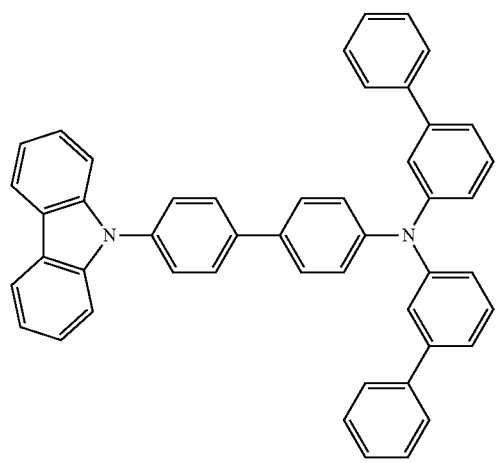
HT10
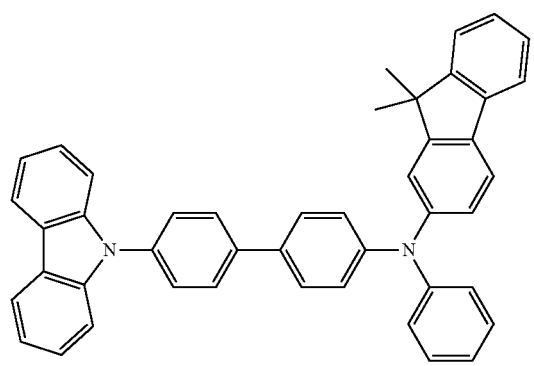
HT11
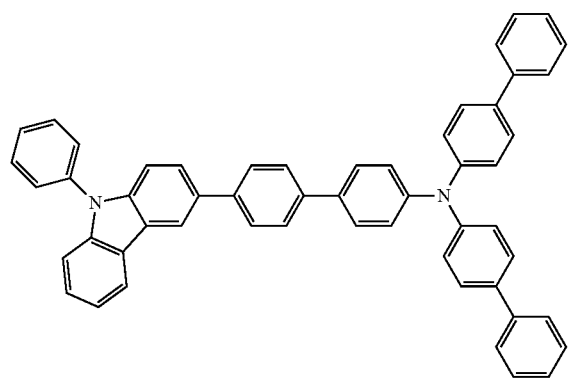
HT12
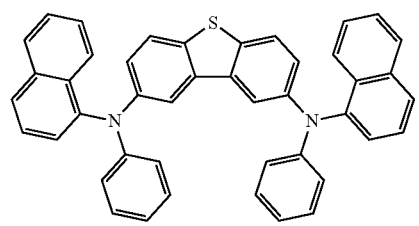

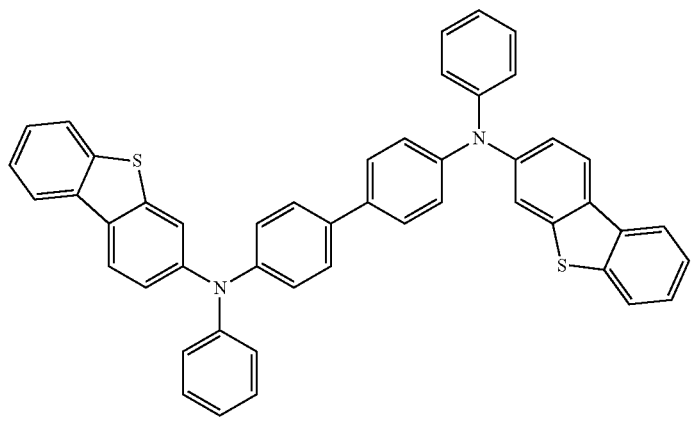

HT13

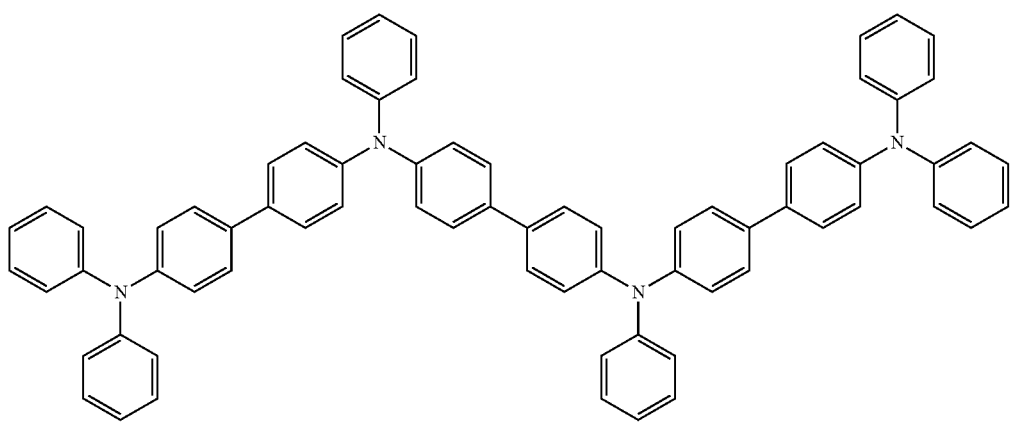

HT14

Examples of the light emitting material mainly involved in a light emitting function include: aromatic hydrocarbon compounds (such as a fluorene derivative, a naphthalene derivative, a pyrene derivative, a perylene derivative, a tetracene derivative, an anthracene derivative, and rubrene); a quinacridone derivative; a coumarin derivative; a stilbene derivative; an organic aluminum complex such as tris(8-quinolinolato) aluminum; an iridium complex; a platinum complex; a rhenium complex; a copper complex; a europium complex; a ruthenium complex; and polymer derivatives such as a poly(phenylene vinylene) derivative, a poly(fluorene) derivative, and a poly(phenylene) derivative. Specific examples of a compound to be used as the light emitting material are shown below. However, the compound is of course not limited thereto.

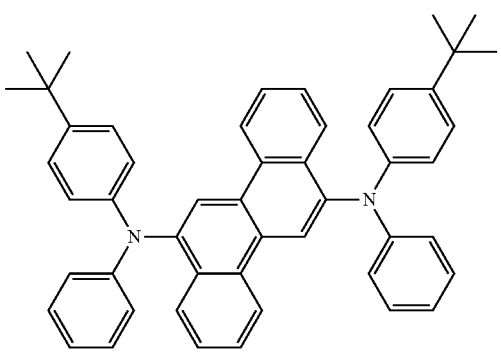

BD1

BD2
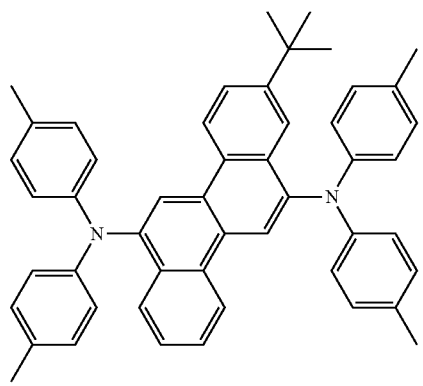
BD6
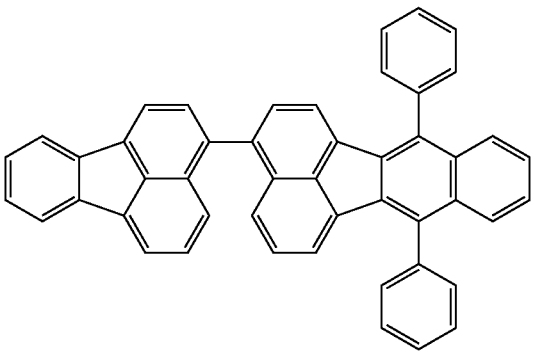
BD3
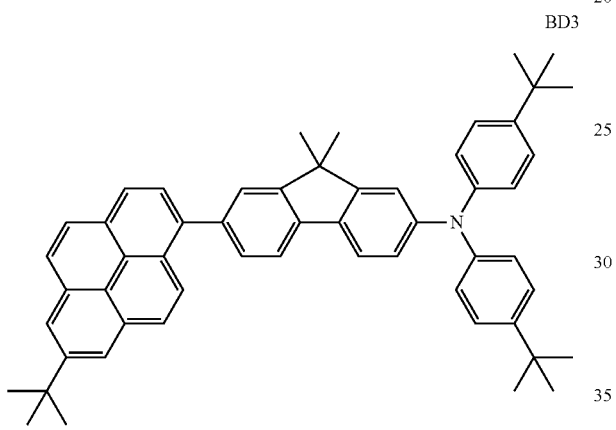
BD7
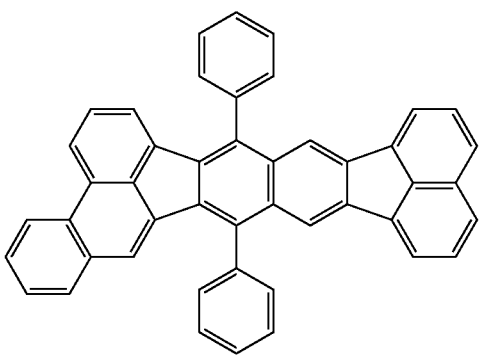
BD8
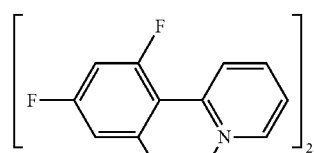
GD1
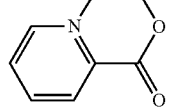
BD4
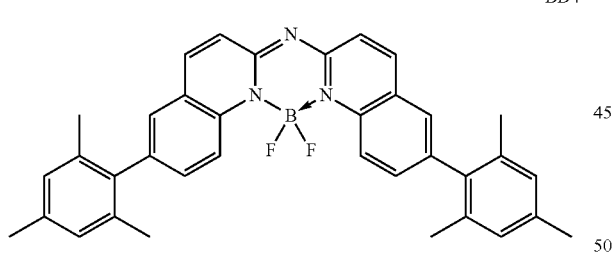
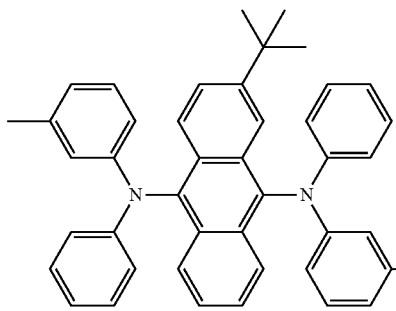
BD5
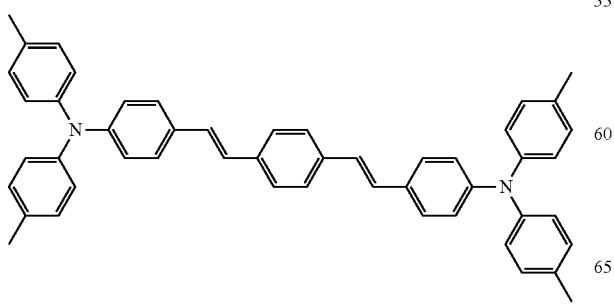
GD2
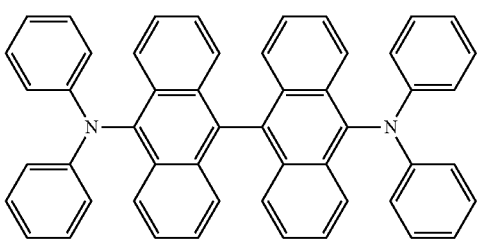

GD3 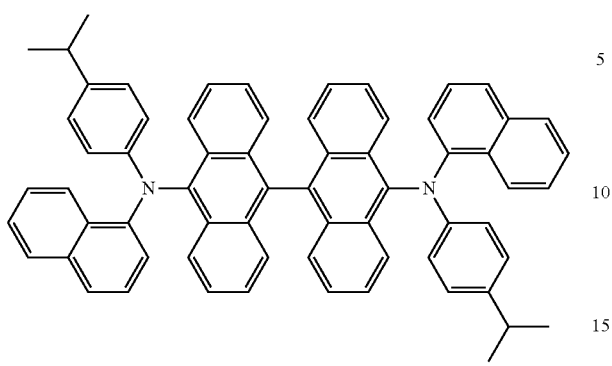
GD8 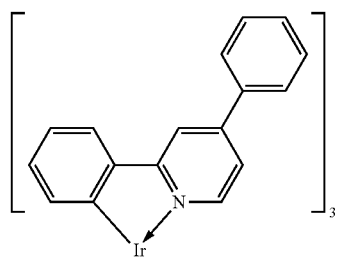
GD4 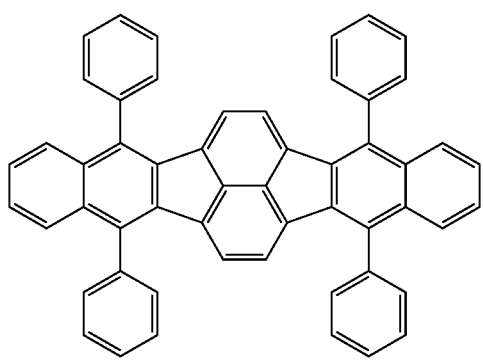
RD1 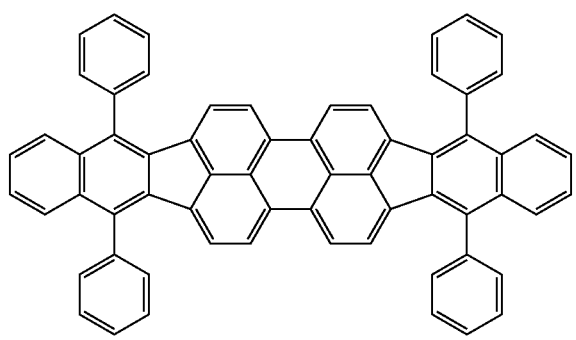
GD5 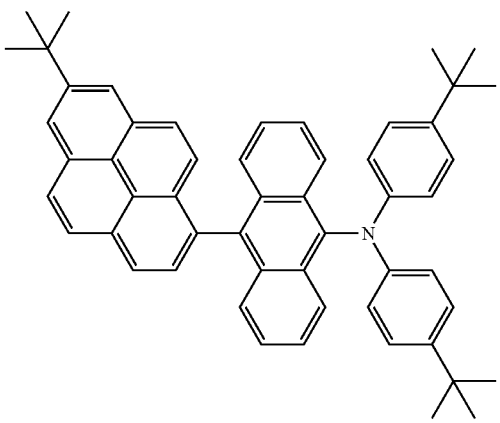
RD2 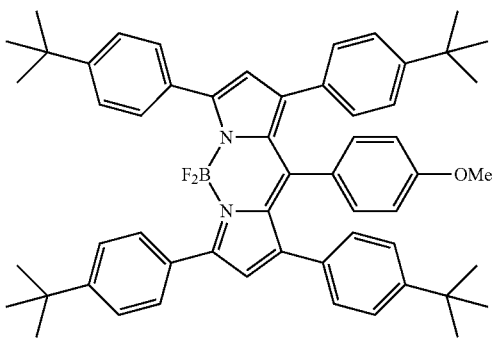
GD6 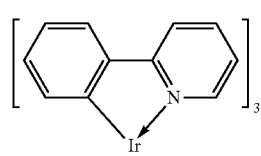
GD7
RD3
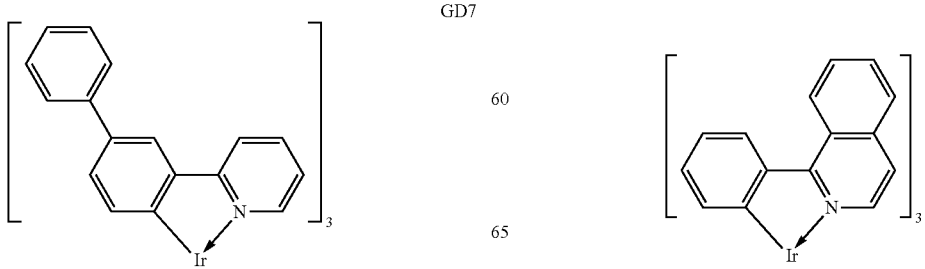

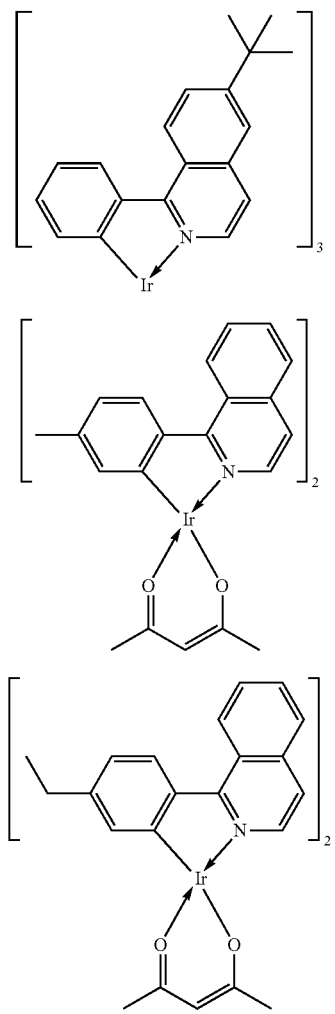
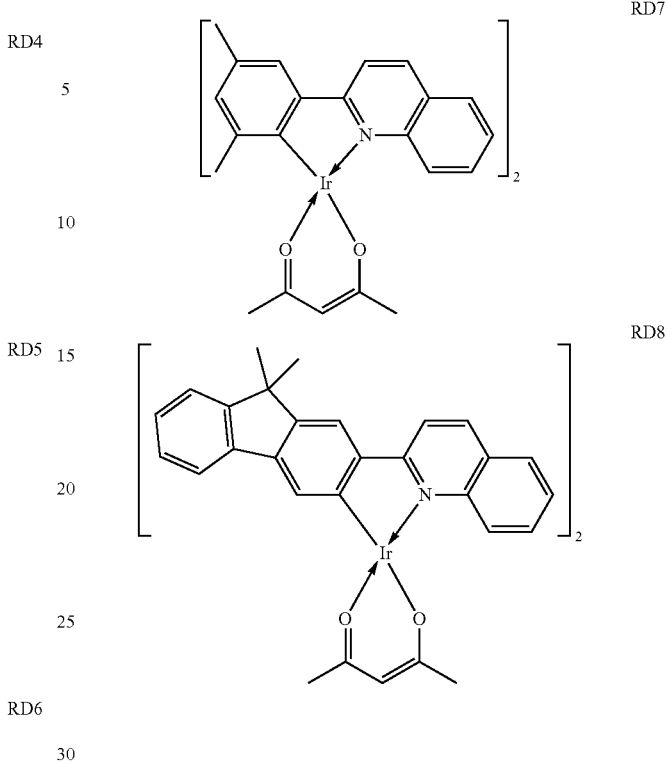

Examples of the light emitting layer host or light emitting assist material to be incorporated into the light emitting layer include: an aromatic hydrocarbon compound or a derivative thereof; a carbazole derivative; a dibenzofuran derivative; a dibenzothiophene derivative; an organic aluminum complex such as tris(8-quinolinolato)aluminum; and an organic beryllium complex. Specific examples of a compound to be used as the light emitting layer host or light emitting assist material to be incorporated into the light emitting layer are shown below. However, the compound is of course not limited thereto.

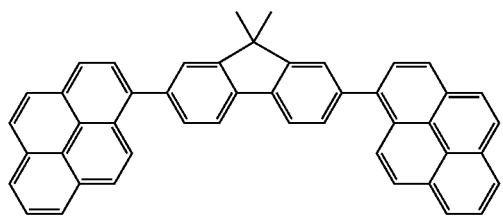
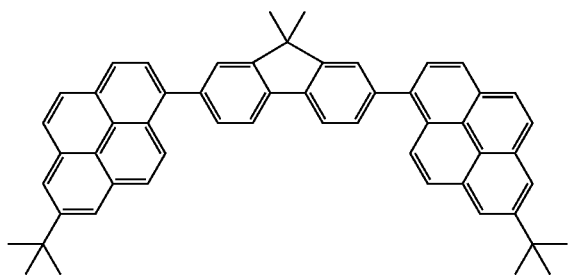
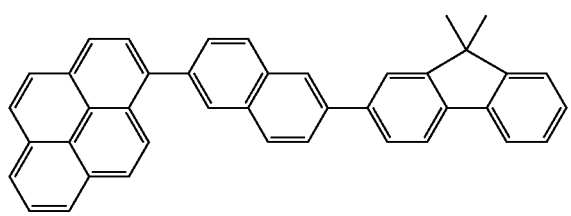
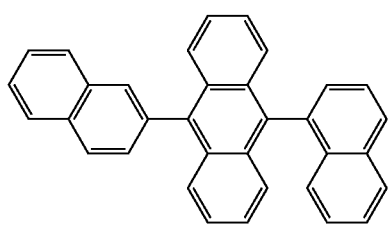

-continued
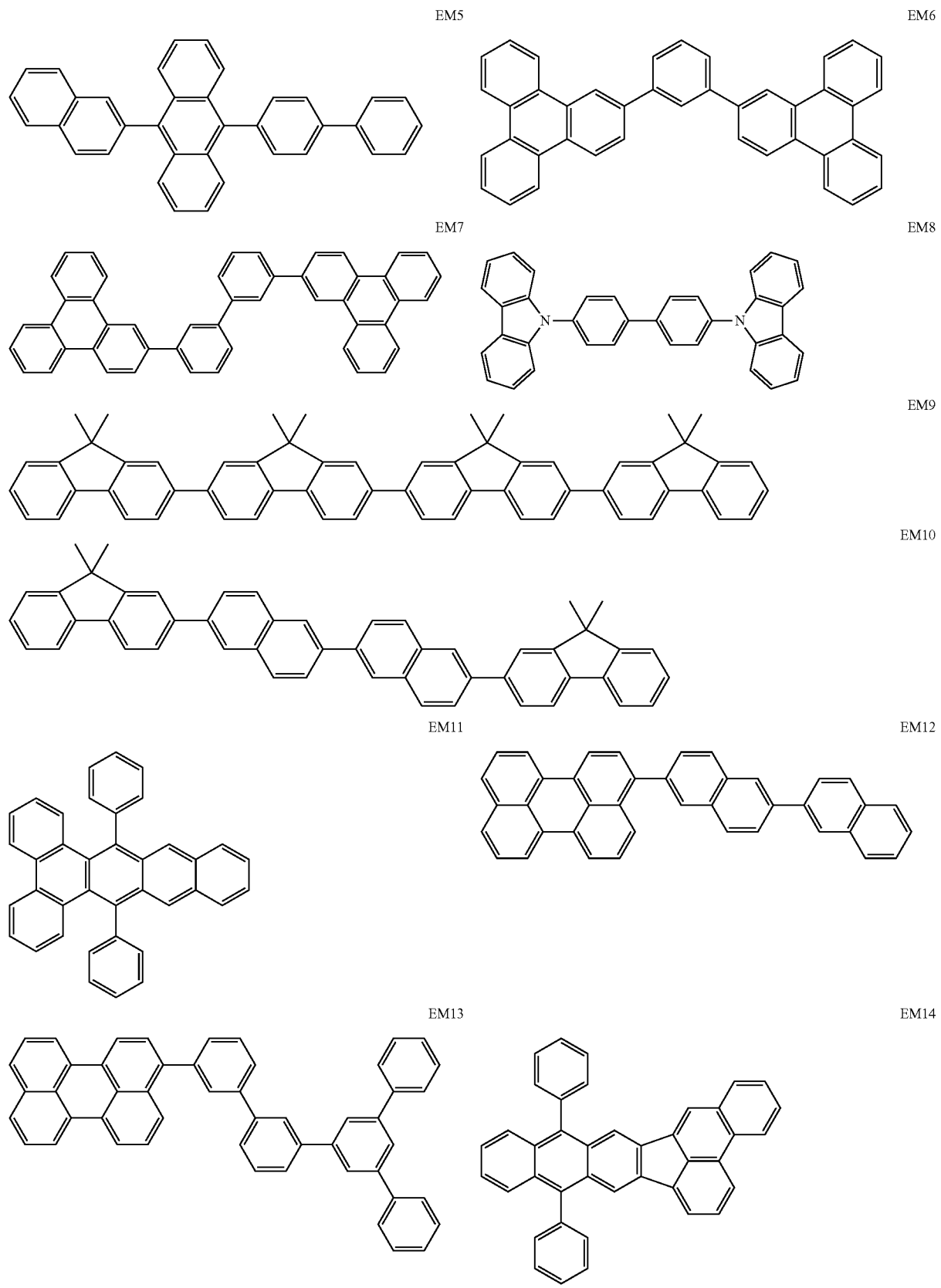

EM15

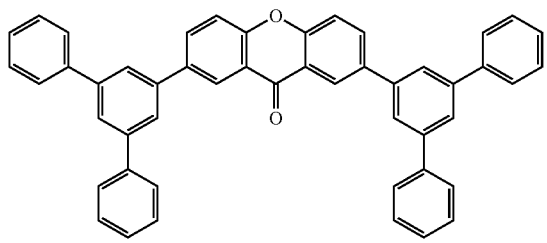

EM16

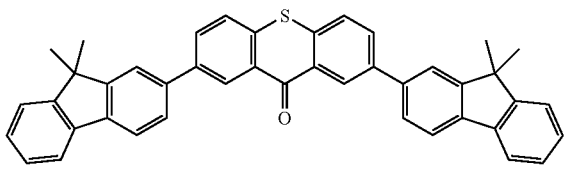

EM17

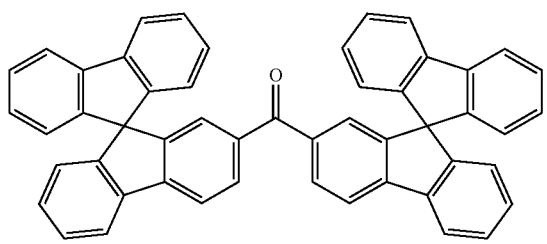

The electron transportable material can be arbitrarily selected from materials that can transport electrons injected from the cathode to the light emitting layer in consideration of, for example, the balance with the hole mobility of the hole transportable material. Examples of the material having electron transport performance include: an oxadiazole derivative, an oxazole derivative, a pyrazine derivative, a triazole derivative, a triazine derivative, a quinoline derivative, a quinoxaline derivative, a phenanthroline derivative, an organic aluminum complex, and fused ring compounds (such as a fluorene derivative, a naphthalene derivative, a chrysene derivative, and an anthracene derivative). Further, the electron transportable material is suitably used for the hole blocking layer as well. Specific examples of a compound to be used as the electron transportable material or the electron injectable material are shown below. However, the compound is of course not limited thereto.

ET1

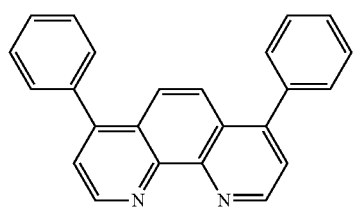

ET2

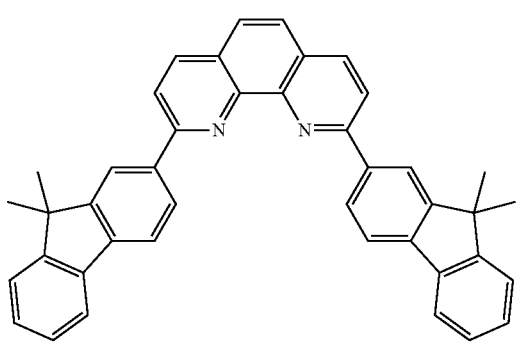

ET3

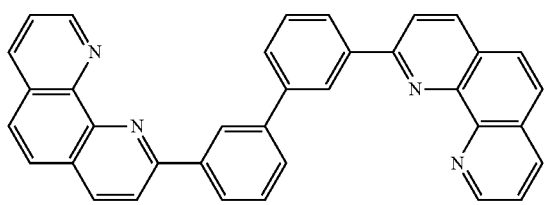

ET4

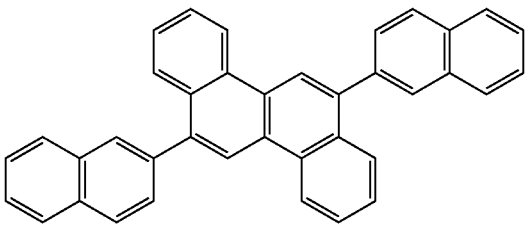

ET5

ET6 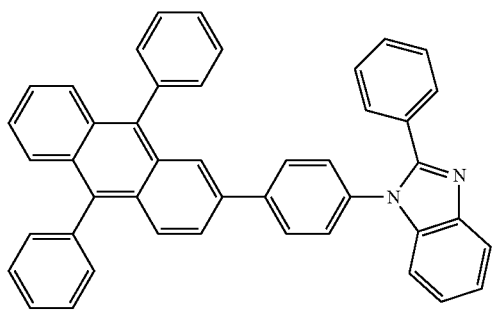

ET10 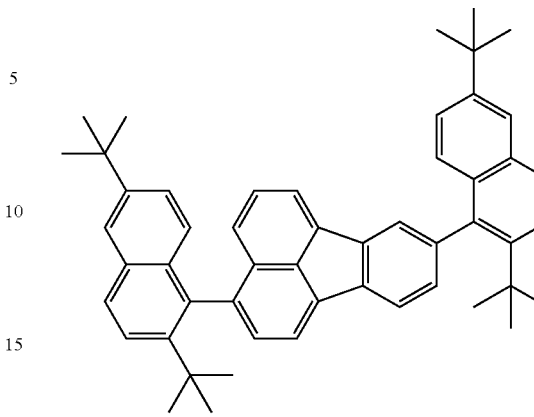

ET7 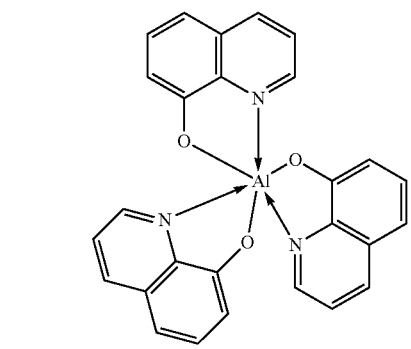

ET8 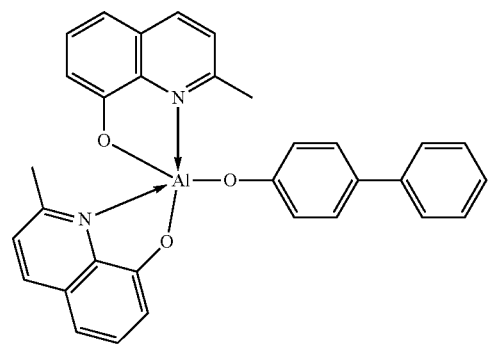

ET9 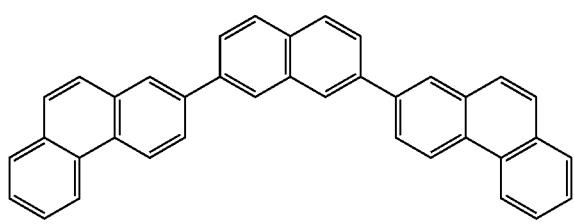

A constituent material for the anode desirably has as large a work function as possible. Examples thereof may include: metal simple substances such as gold, platinum, silver, copper, nickel, palladium, cobalt, selenium, vanadium, and tungsten or alloys obtained by combining these metal simple substances; metal oxides such as tin oxide, zinc oxide, indium oxide, indium tin oxide (ITO), and indium zinc oxide; and conductive polymers such as polyaniline, polypyrrole, and polythiophene. One kind of those electrode substances may be used alone, or two or more kinds thereof may be used in combination. In addition, the anode may be of a single-layer construction or may be of a multilayer construction.

On the other hand, a constituent material for the cathode desirably has as small a work function as possible. Examples thereof include: alkali metals such as lithium; alkaline earth metals such as calcium; and metal simple substances such as aluminum, titanium, manganese, silver, lead, and chromium. Alternatively, alloys obtained by combining those metal simple substances can be used. For example, a magnesium-silver alloy, an aluminum-lithium alloy, or an aluminum-magnesium alloy can be used. A metal oxide such as indium tin oxide (ITO) can also be utilized. One kind of those electrode substances may be used alone, or two or more kinds thereof may be used in combination. In addition, the cathode may be of a single-layer construction or may be of a multi-layer construction.

The organic compound layer (such as the hole injecting layer, the hole transport layer, the electron blocking layer, the light emitting layer, the hole blocking layer, the electron transport layer, or the electron injecting layer) for forming the organic light emitting element of the present invention is formed by a dry process such as a vacuum vapor deposition method, an ionized vapor deposition method, sputtering, or a plasma process. In addition, a wet process involving dissolving the constituent materials in an appropriate solvent and forming a layer by a known application method (such as spin coating, dipping, a casting method, an LB method, or an ink jet method) can be used instead of the dry process. When the layer is formed by the vacuum vapor deposition method, the solution application method, or the like, the layer hardly undergoes crystallization or the like and is excellent in stability over time. In addition, when the layer is formed by the application method, the film can be formed by using the constituent materials in combination with an appropriate binder resin.

Examples of the binder resin include, but not limited to, a polyvinyl carbazole resin, a polycarbonate resin, a polyester resin, an ABS resin, an acrylic resin, a polyimide resin, a phenol resin, an epoxy resin, a silicone resin, and a urea resin. In addition, one kind of those binder resins may be used alone as a homopolymer or a copolymer, or two or more kinds thereof may be used as a mixture. Further, a known additive such as a plasticizer, an antioxidant, or a UV absorber may be used in combination as required.

<Application of Organic Light Emitting Element>

The organic light emitting element of the present invention may be connected to an active element such as a switching element containing an oxide semiconductor in its channel portion in order to control light emission of the light emitting element. The oxide semiconductor in the channel portion may be amorphous, crystalline, or a mixture thereof. The crystal may be any one kind of a single crystal, a fine crystal, and a crystal in which a specific axis such as a c axis is oriented, or may be a mixture of at least two or more kinds thereof.

Such organic light emitting element including an active element may be used in an image display apparatus in which the organic light emitting element is provided as a pixel, or as an exposing portion configured to expose a photosensitive member in a lighting apparatus or an image forming apparatus of an electrophotographic system such as a laser beam printer or a copying machine.

The image display apparatus includes the organic light emitting element of the present invention in a display portion. The display portion includes a plurality of pixels, and the plurality of pixels each include the organic light emitting element of the present invention and an active element connected to the organic light emitting element. Examples of the active element include a switching element and an amplifying element configured to control the luminance of light emission, and a specific example thereof is a transistor. The anode or cathode of the organic light emitting element and a drain electrode or source electrode of the transistor are electrically connected to each other. Herein, the display apparatus may be used as an image display apparatus for a PC or the like.

The image display apparatus may be an image information processing apparatus that includes an image input portion configured to input image information from, for example, an area CCD, a linear CCD, or a memory card, and displays an input image on its display portion.

In addition, as a display portion of an image pick-up apparatus or inkjet printer, the image display apparatus may have both of an image output function of displaying image information input from the exterior and an input function, as an operation panel, of inputting information for processing the image. In addition, the display apparatus may be used in a display portion of a multifunction printer.

An image display apparatus using the organic light emitting element of the present invention is described with reference to FIGURE.

FIGURE is a schematic sectional view illustrating an example of an image display apparatus including: the organic light emitting element of the present invention; and a TFT element, which is an example of a switching element, connected to the organic light emitting element. In an image display apparatus 20 of FIGURE, two combinations of the organic light emitting element and the TFT element are illustrated. A detailed construction thereof is hereinafter described.

As illustrated in FIGURE, on a substrate 1 made of glass or the like, a moisture-proof protective film 2 for protecting a TFT element 8 and an organic compound layer 12 is provided.

The TFT element 8 includes a gate electrode 3 made of a metal or the like, a gate insulating film 4, a semiconductor layer 5, a drain electrode 6, and a source electrode 7. An insulating film 9 is provided on the upper part of the TFT element 8. An anode 11 of the organic light emitting element and the source electrode 7 are connected to each other through a contact hole 10. The construction of the display apparatus is not limited to the above-mentioned construction, and any construction may be adopted as long as any one of the anode 11 and a cathode 13 is connected to any one of the source electrode 7 and the drain electrode 6 of the TFT element 8.

In the display apparatus 20 of FIGURE, the organic compound layer 12 is illustrated as if the organic compound layer formed of a single layer or a plurality of layers were one layer. On the cathode 13, a first protective layer 14 and a second protective layer 15 for suppressing degradation of the organic light emitting element are provided.

In the display apparatus of the present invention, a MIM element may be used as the switching element instead of a transistor.

A lighting apparatus is an apparatus for lighting, for example, the inside of a room. The lighting apparatus may emit light having any one of the following colors: a white color, a daylight color, and colors ranging from blue to red colors. In the present invention, the color temperature of the white color is 4,200 K and the color temperature of the daylight color is 5,000 K. The lighting apparatus may further include a color filter.

The lighting apparatus of the present invention includes the organic light emitting element of the present invention and an active element connected to the organic light emitting element, preferably an AC/DC converter circuit connected to the organic light emitting element configured to supply a driving voltage. The AC/DC converter circuit in the present invention is a circuit configured to convert an AC voltage into a DC voltage.

The image forming apparatus of the present invention includes an exposing apparatus and a photosensitive member to be exposed by the exposing apparatus. Further, the image forming apparatus preferably includes a charging portion configured to charge the surface of the photosensitive member and a developing unit configured to develop an electrostatic latent image formed on the surface of the photosensitive member. The exposing apparatus includes the organic light emitting element of the present invention and an active element connected to the organic light emitting element. The organic light emitting elements in the exposing portion may be arranged to form a line or in such a form in which the entire exposure surface of the exposing portion emits light.

The active element connected to the organic light emitting element of the present invention may be formed directly on a substrate such as a Si substrate. The phrase "directly on a substrate" means that a substrate such as a Si substrate itself is processed to include a transistor. The transistor is not limited to a transistor using a monocrystalline silicon wafer and may be a thin-film transistor including an active layer on the insulating surface of a substrate. The thin-film transistor is also called a TFT element. In addition, although the transistor may be a thin-film transistor using monocrystalline silicon as the active layer, a thin-film transistor using non-monocrystalline silicon such as amorphous silicon or microcrystalline silicon as the active layer, or a thin-film transistor using a non-monocrystalline oxide semiconductor such as an indium zinc oxide (IZO) or indium gallium zinc oxide (IGZO) as the active layer, a transistor containing an oxide semiconductor in its channel portion is preferred as described above.

In addition to the above-mentioned applications, the organic light emitting element of the present invention finds use in applications such as a backlight for a liquid crystal display apparatus, a white light source without a color filter, a light emitting apparatus including a color filter, a white light source, and the like. An example of the color filter is a filter that transmits at least any one of red color light, green color light, and blue color light. The light emitting apparatus may be an apparatus combining a filter configured to adjust the chromaticity of a white color and a white light source.

It should be noted that the lithium complex compound represented by the general formula [1] may be used for an organic solar cell, an organic TFT, a fluorescence recognition material for a living organism or the like, a film, a filter, or the like, as an application other than the organic light emitting element.

SYNTHESIS EXAMPLE 1

Synthesis of Exemplary Compound A1

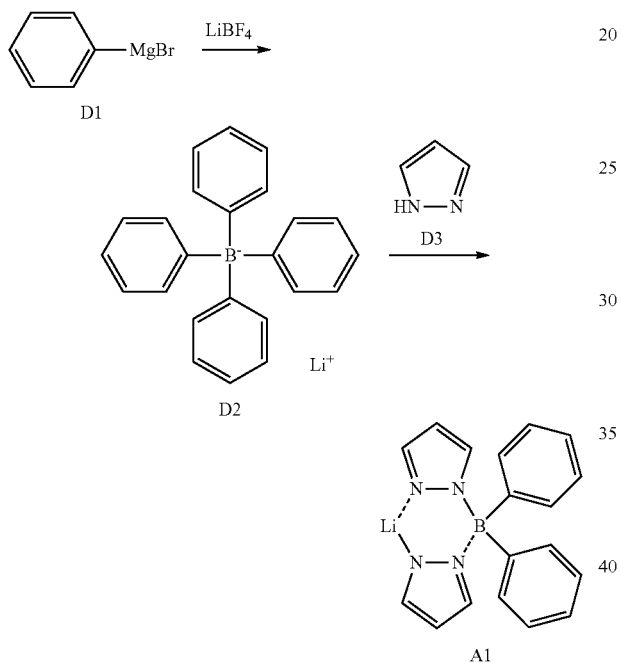

(1) Synthesis of Compound D2

The following compound and solvent were loaded into a 200-mL recovery flask.

D1: 120 ml (1.0 M in THF solution/manufactured by Sigma-Aldrich Co. LLC.) (12.0 mmol)

LiBF$_4$: 2,325 mg (2.5 mmol/manufactured by Wako Pure Chemical Industries, Ltd.)

The reaction solution was stirred for 24 hours. After completion of the reaction, THF was distilled away under reduced pressure, and then 100 ml of diethyl ether were added thereto. The resultant solution was gradually added to 150 ml of a 2 M sodium carbonate aqueous solution and stirring was performed at room temperature for 30 minutes. After that, the organic layer was separated from the water layer. The organic layer was filtered by using a funnel having celite thereon ("Kiriyama-funnel" manufactured by Kiriyama glass Co.), and dried by using magnesium sulfate. Magnesium sulfate was removed through filtration and then diethyl ether was distilled away under reduced pressure. The resultant was recrystallized through addition of hexane. The obtained crystal was vacuum dried. Thus, 6.2 g of a compound D2 were obtained (yield: 76%).

(2) Synthesis of Exemplary Compound A1

Subsequently, the following compounds were loaded into a 20-mL recovery flask.

D2: 978 mg (3.0 mmol)

D3: 2,041 mg (30.0 mmol/manufactured by Tokyo Chemical Industry Co., Ltd.)

After the two compounds were mixed, the temperature was gradually increased and stirring was performed at 140° C. for 1 hour. Further, the temperature was gradually increased to cause a reaction at 180° C. for 1 hour, and then the temperature was gradually increased to 225° C. to further cause the reaction for 4 hours. At this time, the reaction was performed while a material to be detached and refluxed upon the reaction was distilled away.

After the reaction, the mixture was once cooled. Then, the temperature was increased to 160° C. while vacuum of about $10^{-2}$ Pa was maintained with a vacuum pump, to thereby distil away unreacted D3 in the system under a reduced pressure. After that, the obtained solid was recrystallized by using a hexane/methylene chloride mixed solvent. The obtained crystal was vacuum dried at 100° C. and then subjected to sublimation purification. Thus, 510 mg of an exemplary compound A1 were obtained (yield: 55%).

The result of identification of the obtained compound was described below.

[DART-MS (Accutof+DART manufactured by JEOL Ltd.)]

Measured value: m/z=306.03, Calculated value: $C_{18}H_{16}BLiN_4$=306.16

SYNTHESIS EXAMPLE 2

Synthesis of Exemplary Compound A2

An exemplary compound A2 was obtained in the same manner as in Synthesis Example 1 except that the following compound D4 (1.0 M in THF solution/manufactured by Sigma-Aldrich Co. LLC.) was used instead of the compound D1 in the section (1) of Synthesis Example 1.

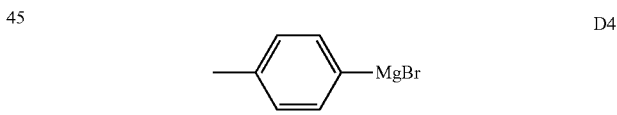

The result of identification of the obtained compound was described below.

[DART-MS (Accutof+DART manufactured by JEOL Ltd.)]

Measured value: m/z=333.57, Calculated value: $C_{20}H_{20}BLiN_4$=334.19

SYNTHESIS EXAMPLE 3

Synthesis of Exemplary Compound A5

An exemplary compound A5 was obtained in the same manner as in Synthesis Example 1 except that the following compound D5 (1.0 M in THF solution/manufactured by Sigma-Aldrich Co. LLC.) was used instead of the compound D1 in the section (1) of Synthesis Example 1.

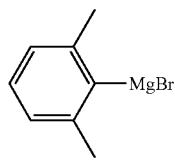

D5

The result of identification of the obtained compound was described below.
[DART-MS (Accutof+DART manufactured by JEOL Ltd.)]
Measured value: m/z=362.11, Calculated value: $C_{22}H_{24}BLiN_4$=362.23

SYNTHESIS EXAMPLE 4

Synthesis of Exemplary Compound A6

An exemplary compound A6 was obtained in the same manner as in Synthesis Example 1 except that the following compound D6 (1.0 M in THF solution/manufactured by Sigma-Aldrich Co. LLC.) was used instead of the compound D1 in the section (1) of Synthesis Example 1.

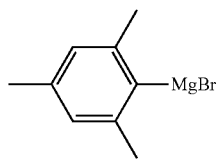

D6

The result of identification of the obtained compound was described below.
[DART-MS (Accutof+DART manufactured by JEOL Ltd.)]
Measured value: m/z=389.59, Calculated value: $C_{24}H_{28}BLiN_4$=390.26

SYNTHESIS EXAMPLE 5

Synthesis of Exemplary Compound A7

An exemplary compound A7 was obtained in the same manner as in Synthesis Example 1 except that the following compound D7 (0.5 M in THF solution/manufactured by Sigma-Aldrich Co. LLC.) was used instead of the compound D1 in the section (1) of Synthesis Example 1.

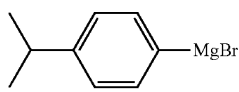

D7

The result of identification of the obtained compound was described below.
[DART-MS (Accutof+DART manufactured by JEOL Ltd.)]
Measured value: m/z=389.87, Calculated value: $C_{24}H_{28}BLiN_4$=390.26

SYNTHESIS EXAMPLE 6

Synthesis of Exemplary Compound A8

An exemplary compound A8 was obtained in the same manner as in Synthesis Example 1 except that the following compound D8 (0.5 M in THF solution/manufactured by Sigma-Aldrich Co. LLC.) was used instead of the compound D1 in the section (1) of Synthesis Example 1.

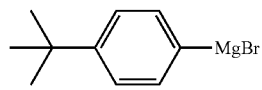

D8

The result of identification of the obtained compound was described below.
[DART-MS (Accutof+DART manufactured by JEOL Ltd.)]
Measured value: m/z=418.10, Calculated value: $C_{26}H_{32}BLiN_4$=418.29

SYNTHESIS EXAMPLE 7

Synthesis of Exemplary Compound A11

An exemplary compound A11 was obtained in the same manner as in Synthesis Example 1 except that the following compound D9 (0.5 M in THF solution/manufactured by Sigma-Aldrich Co. LLC.) was used instead of the compound D1 in the section (1) of Synthesis Example 1.

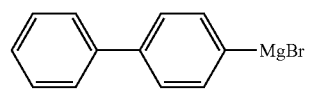

D9

The result of identification of the obtained compound was described below.
[DART-MS (Accutof+DART manufactured by JEOL Ltd.)]
Measured value: m/z=457.83, Calculated value: $C_{30}H_{24}BLiN_4$=458.23

SYNTHESIS EXAMPLE 8

Synthesis of Exemplary Compound A14

An exemplary compound A14 was obtained in the same manner as in Synthesis Example 1 except that the following compound D10 (0.5 M in THF solution/manufactured by Sigma-Aldrich Co. LLC.) was used instead of the compound D1 in the section (1) of Synthesis Example 1.

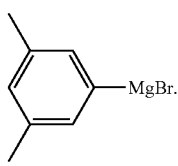

D10

The result of identification of the obtained compound was described below.
[DART-MS (Accutof+DART manufactured by JEOL Ltd.)]
Measured value: m/z=362.12, Calculated value: $C_{22}H_{24}BLiN_4$=362.23

SYNTHESIS EXAMPLE 9

Synthesis of Exemplary Compound A17

An exemplary compound A17 was obtained in the same manner as in Synthesis Example 1 except that the following compound D11 (1.0 M in THF solution/manufactured by Sigma-Aldrich Co. LLC.) was used instead of the compound D1 in the section (1) of Synthesis Example 1.

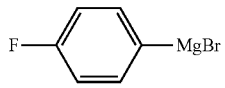

D11

The result of identification of the obtained compound was described below.
[DART-MS (Accutof+DART manufactured by JEOL Ltd.)]
Measured value: m/z=341.55, Calculated value: $C_{18}H_{14}BF_2LiN_4$=342.14

SYNTHESIS EXAMPLE 10

Synthesis of Exemplary Compound A18

An exemplary compound A18 was obtained in the same manner as in Synthesis Example 1 except that the following compound D12 (1.0 M in THF solution/manufactured by Sigma-Aldrich Co. LLC.) was used instead of the compound D1 in the section (1) of Synthesis Example 1.

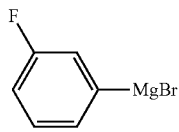

D12

The result of identification of the obtained compound was described below.
[DART-MS (Accutof+DART manufactured by JEOL Ltd.)]
Measured value: m/z=341.11, Calculated value: $C_{18}H_{14}BF_2LiN_4$=342.14

SYNTHESIS EXAMPLE 11

Synthesis of Exemplary Compound A20

An exemplary compound A20 was obtained in the same manner as in Synthesis Example 1 except that the following compound D13 (0.5 M in THF solution/manufactured by Sigma-Aldrich Co. LLC.) was used instead of the compound D1 in the section (1) of Synthesis Example 1.

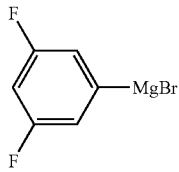

D13

The result of identification of the obtained compound was described below.
[DART-MS (Accutof+DART manufactured by JEOL Ltd.)]
Measured value: m/z=377.55, Calculated value: $C_{18}H_{12}BF_4LiN_4$=378.13

SYNTHESIS EXAMPLE 12

Synthesis of Exemplary Compound A23

An exemplary compound A23 was obtained in the same manner as in Synthesis Example 1 except that the following compound D14 (0.5 M in THF solution/manufactured by Sigma-Aldrich Co. LLC.) was used instead of the compound D1 in the section (1) of Synthesis Example 1.

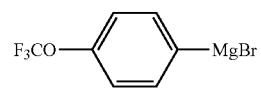

D14

The result of identification of the obtained compound was described below.
[DART-MS (Accutof+DART manufactured by JEOL Ltd.)]
Measured value: m/z=473.22, Calculated value: $C_{20}H_{14}BF_6LiN_4O_2$=474.13

SYNTHESIS EXAMPLE 13

Synthesis of Exemplary Compound A24

An exemplary compound A24 was obtained in the same manner as in Synthesis Example 1 except that the following compound D15 (0.5 M in THF solution/manufactured by Sigma-Aldrich Co. LLC.) was used instead of the compound D1 in the section (1) of Synthesis Example 1.

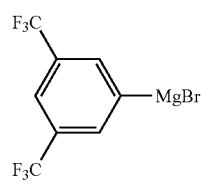

D15

The result of identification of the obtained compound was described below.
[DART-MS (Accutof+DART manufactured by JEOL Ltd.)]
Measured value: m/z=577.32, Calculated value: $C_{22}H_{12}BF_{12}LiN_4$=578.11

SYNTHESIS EXAMPLE 14

Synthesis of Exemplary Compound A25

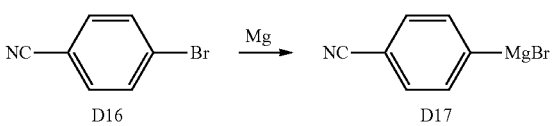

(1) Synthesis of Compound D17
Mg: 360 mg (15.0 mmol/manufactured by Sigma-Aldrich Co. LLC.)
D16: 2,352 mg (13.0 mmol/manufactured by Tokyo Chemical Industry Co., Ltd.)

Mg was activated in 50 ml of an ether through addition of 3 mg of iodine. 50 ml of an ether solution of the compound D16 were added thereto over 1 hour, and further stirring was performed for 2 hours. Thus, an ether solution of a compound D17 was obtained.

(2) Synthesis of Exemplary Compound A25

An exemplary compound A25 was obtained in the same manner as in Synthesis Example 1 except that the ether solution of a compound D17 was used instead of the compound D1 in the section (1) of Synthesis Example 1.

The result of identification of the obtained compound was described below.
[DART-MS (Accutof+DART manufactured by JEOL Ltd.)]
Measured value: m/z=355.81, Calculated value: $C_{20}H_{14}BLiN_6$=356.15

SYNTHESIS EXAMPLE 15

Synthesis of Exemplary Compound A29

An exemplary compound A29 was obtained in the same manner as in Synthesis Example 1 except that the following compound D18 (0.5 M in THF solution/manufactured by Sigma-Aldrich Co. LLC.) was used instead of the compound D1 in the section (1) of Synthesis Example 1.

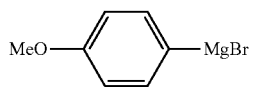

D18

The result of identification of the obtained compound was described below.
[DART-MS (Accutof+DART manufactured by JEOL Ltd.)]
Measured value: m/z=365.77, Calculated value: $C_{20}H_{20}BLiN_4O_2$=366.18

SYNTHESIS EXAMPLE 16

Synthesis of Exemplary Compound B1

An exemplary compound B1 was obtained in the same manner as in Synthesis Example 1 except that the following compound D19 (manufactured by Tokyo Chemical Industry Co., Ltd.) was used instead of the compound D3 in the section (2) of Synthesis Example 1. It should be noted that the compound was partially decomposed during its sublimation purification.

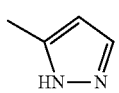

D19

SYNTHESIS EXAMPLE 17

Synthesis of Exemplary Compound B3

An exemplary compound B3 was obtained in the same manner as in Synthesis Example 1 except that the following compound D20 (manufactured by Synthonix Inc.) was used instead of the compound D3 in the section (2) of Synthesis Example 1.

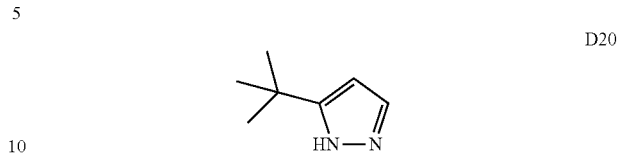

D20

The result of identification of the obtained compound was described below.
[DART-MS (Accutof+DART manufactured by JEOL Ltd.)]
Measured value: m/z=417.59, Calculated value: $C_{26}H_{32}BLiN_4$=418.29

SYNTHESIS EXAMPLE 18

Synthesis of Exemplary Compound C5

An exemplary compound C5 was obtained in the same manner as in Synthesis Example 1 except that the compound D11 was used instead of the compound D1 in the section (1) of Synthesis Example 1 and the compound D19 was used instead of the compound D3 in the section (2) of Synthesis Example 1.

The result of identification of the obtained compound was described below.
[DART-MS (Accutof+DART manufactured by JEOL Ltd.)]
Measured value: m/z=397.38, Calculated value: $C_{22}H_{22}BF_2LiN_4$=398.21

REFERENCE SYNTHESIS EXAMPLE

A similar reaction was performed by using a compound D21 (manufactured by Sigma-Aldrich Co. LLC.) instead of the compound D2 in the section (2) of Synthesis Example 1, but the reaction did not proceed and a compound D22 was not able to be obtained. This revealed that not all alkali metal compounds allowed similar compounds to the lithium complex compound represented by the general formula [1] to be synthesized easily.

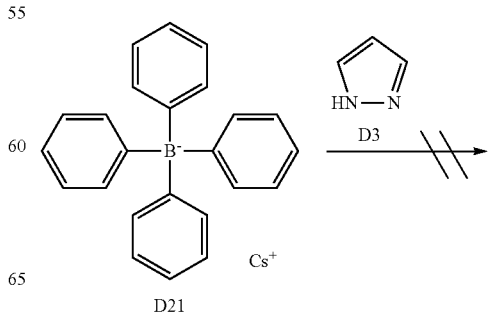

D21

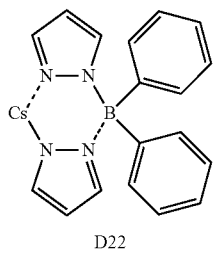

D22

<Evaluation of Stability to Water>

The exemplary compound A1, the exemplary compound A17, lithium fluoride (comparative compound 1), cesium fluoride (comparative compound 2), the compound 1-A disclosed in International Publication No. WO2013/079676 (comparative compound 3) were each deposited on a glass substrate to form a film having a thickness of 100 nm. Water was dropped onto the films, and the states of the films were examined after 1 minute and 10 minutes with a thickness step height meter (Alpha-Step). The results are shown in Table 1.

TABLE 1

| | After 1 min | After 10 min |
|---|---|---|
| Exemplary compound A1 | Not changed | Not changed |
| Exemplary compound A17 | Not changed | Not changed |
| Comparative compound 1 | Dissolved | Dissolved |
| Comparative compound 2 | Dissolved | Dissolved |
| Comparative compound 3 | Partially dissolved | Dissolved |

First, ITO was formed into a film on a glass substrate and then subjected to desired patterning processing to form an ITO electrode (anode). At this time, the thickness of the ITO electrode was set to 100 nm. The substrate on which the ITO electrode had been thus formed was used as an ITO substrate in the following steps.

Organic compound layers and electrode layers shown in Table 2 were continuously formed on the ITO substrate. As materials G-1 to G-8 in Table 2, compounds shown in Table 3 were used. In this case, the element was immersed in water for 10 minutes after formation of the electron injecting layer, and then vacuum dried at 120° C. After that, the metal electrode layer was formed thereon. It should be noted that at this time, the electrode area of the opposing electrode (metal electrode layer, cathode) was set to 3 $mm^2$.

TABLE 2

| | Material | Thickness (nm) |
|---|---|---|
| Hole transport layer | G-1 | 30 |
| Electron blocking layer | G-2 | 10 |
| Light emitting layer | G-3 (Host) G-4 (Guest) (G-3:G-4 = 98:2 (weight ratio)) | 30 |
| Hole blocking layer | G-5 | 10 |
| Electron transport layer | G-6 | 15 |
| Electron injecting layer | G-7 G-8 (G-7:G-8 = 50:50 (weight ratio)) | 15 |
| Metal electrode layer | Al | 100 |

TABLE 3

| | G-1 | G-2 | G-3 | G-4 | G-5 | G-6 | G-7 | G-8 | Light emitting state |
|---|---|---|---|---|---|---|---|---|---|
| Example 1 | HT1 | HT7 | EM1 | BD7 | ET2 | ET2 | ET2 | A1 | ○ |
| Example 2 | HT1 | HT7 | EM1 | BD7 | ET2 | ET2 | ET2 | A17 | ○ |
| Comparative Example 1 | HT1 | HT7 | EM1 | BD7 | ET2 | ET2 | ET2 | Comparative Compound 1 | × |
| Comparative Example 2 | HT1 | HT7 | EM1 | BD7 | ET2 | ET2 | ET2 | Comparative Compound 2 | × |
| Comparative Example 3 | HT1 | HT7 | EM1 | BD7 | ET2 | ET2 | ET2 | Comparative Compound 3 | × |

The results shown in Table 1 revealed that an alkali metal salt such as lithium fluoride or cesium fluoride was dissolved immediately after the film was soaked in water. In addition, the comparative compound 3 was more stable to water than the alkali metal salts, but was gradually dissolved. This seems to be because all the ligands were water-soluble pyrazole, and its unshared electron pair was coordinated to water. On the other hand, it was revealed that both the lithium complex compounds represented by the general formula [1] were not dissolved in water and were hydrophobic compounds.

EXAMPLES 1 AND 2 AND COMPARATIVE EXAMPLE 1 TO 3

In these examples, an organic light emitting element in which "an anode, a hole transport layer, an electron blocking layer, a light emitting layer, a hole/exciton blocking layer (hole blocking layer), an electron transport layer, an electron injecting layer, and a cathode (metal electrode layer)" were formed on a substrate in the stated order was produced.

The elements were each confirmed for light emission by applying a voltage of 4 V. As shown in Table 3, light emission was able to be confirmed for the elements according to Examples 1 and 2 (represented by Symbol "○"), but light emission was not able to be confirmed for the elements according to Comparative Examples 1 to 3 (represented by Symbol "×"). This seems to be because the comparative compounds 1 to 3 were eluted out or transformed in the immersion in water, and the electron injecting property was lost.

EXAMPLES 3 TO 13

Organic light emitting elements were produced in the same manner as in Examples 1 and 2 except that immersion in water after formation of the electron injecting layer was not performed and compounds shown in Table 4 were used as the materials G-1 to G-8 in Table 2. The elements were each measured for the luminous efficiency by applying a voltage shown in Table 4, and the results are shown in Table 4. In addition, the element according to Example 4 was measured for durability lifetime. The result was that the element had a long lifetime of 1,500 hours or more until light emission was degraded by 5% at 1,000 $cd/m^2$.

TABLE 4

| | G-1 | G-2 | G-3 | G-4 | G-5 | G-6 | G-7 | G-8 | Luminous efficiency (cd/A) | Voltage (V) |
|---|---|---|---|---|---|---|---|---|---|---|
| Example 3 | HT6 | HT7 | EM1 | BD1 | ET2 | ET2 | ET3 | A1 | 6 | 4 |
| Example 4 | HT6 | HT8 | EM13 | RD1 | ET4 | ET2 | ET2 | A1 | 4 | 4 |
| Example 5 | HT2 | HT4 | EM7 | GD7 | ET4 | ET3 | ET3 | A5 | 15 | 4 |
| Example 6 | HT2 | HT8 | EM9 | RD4 | ET10 | ET2 | ET3 | A8 | 7 | 4 |
| Example 7 | HT6 | HT8 | EM12 | RD1 | ET9 | ET3 | ET3 | A14 | 4 | 4 |
| Example 8 | HT2 | HT9 | EM13 | RD2 | ET4 | ET3 | ET2 | A17 | 5 | 4 |
| Example 9 | HT3 | HT9 | EM5 | RD6 | ET4 | ET3 | ET3 | A20 | 15 | 4 |
| Example 10 | HT6 | HT7 | EM4 | BD7 | ET10 | ET2 | ET3 | A24 | 7 | 6 |
| Example 11 | HT2 | HT8 | EM4 | BD4 | ET5 | ET2 | ET3 | A25 | 5 | 4 |
| Example 12 | HT2 | HT8 | EM9 | GD4 | ET6 | ET2 | ET2 | B1 | 20 | 4 |
| Example 13 | HT2 | HT7 | EM13 | RD2 | ET10 | ET3 | ET3 | C5 | 5 | 4 |

EXAMPLES 14 TO 16

Organic compound layers and electrode layers shown in Table 5 were continuously formed on an ITO substrate produced in the same manner as in Example 1. Compounds shown in Table 6 were used as materials G-1 to G-6 and G-8 in Table 5. It should be noted that at this time, the electrode area of the opposing electrode (metal electrode layer, cathode) was set to 3 mm². The elements were each measured for the luminous efficiency by applying a voltage shown in Table 6, and the results are shown in Table 6.

TABLE 5

| | Material | Thickness (nm) |
|---|---|---|
| Hole transport layer | G-1 | 30 |
| Electron blocking layer | G-2 | 10 |
| Light emitting layer | G-3 (Host) G-4 (Guest) (G-3:G-4 = 98:2 (weight ratio)) | 30 |
| Hole blocking layer | G-5 | 10 |
| Electron transport layer | G-6 | 25 |
| Electron injecting layer | G-8 | 5 |
| Metal electrode layer | Al | 100 |

TABLE 6

| | G-1 | G-2 | G-3 | G-4 | G-5 | G-6 | G-8 | Luminous efficiency (cd/A) | Voltage (V) |
|---|---|---|---|---|---|---|---|---|---|
| Example 14 | HT6 | HT7 | EM1 | BD1 | ET2 | ET3 | A1 | 5 | 4 |
| Example 15 | HT2 | HT9 | EM3 | BD6 | ET5 | ET2 | A18 | 5 | 4 |
| Example 16 | HT2 | HT8 | EM8 | RD4 | ET4 | ET3 | A17 | 12 | 4 |

EXAMPLES 17 AND 18

Elements were produced by changing the mixed weight ratio between the materials G-7 and G-8 for the electron injecting layer in the element construction of Example 3 to G-7:G-8=80:20 and G-7:G-8=40:60. As a result, light emitting elements each exhibiting luminous efficiency of 6 cd/A at the same voltage as in Example 3 of 4 V were able to be produced.

As described above by way of Examples, an element stable to water can be produced by using the lithium complex compound represented by the general formula [1] in a layer to be brought into contact with one of the pair of electrodes, in particular the electron injecting layer, in the organic compound layer. This allows for a stable element having a long lifetime.

As described above by way of embodiments and Examples, the organic light emitting element of the present invention can be driven at a low constant voltage and exhibits high luminous efficiency. In addition, the organic light emitting element of the present invention is an organic light emitting element stable to water and humidity, and hence has an excellent lifetime characteristic.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-014541, filed on Jan. 29, 2014, which is hereby incorporated by reference herein in its entirety.

What is claimed is:

1. An apparatus comprising an organic light emitting element comprising:
    a pair of electrodes; and
    an organic compound layer arranged between the pair of electrodes,
    wherein the organic compound layer contains a lithium complex compound represented by the following general formula [1]:

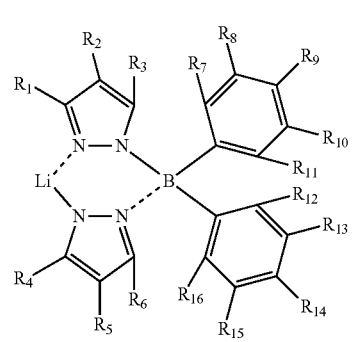

[1]

in the formula [1], $R_1$ to $R_{16}$ each independently represent a hydrogen atom, a halogen atom, a cyano group, an alkyl group that may be substituted with fluorine, an alkoxy group that may be substituted with fluorine, or a substituted or unsubstituted aryl group.

2. The apparatus according to claim 1, wherein the organic compound layer contacts one of the pair of electrodes.

3. The apparatus according to claim 2, wherein the one of the pair of electrodes in contact with the organic compound layer is a cathode.

4. The apparatus according to claim 3, wherein the organic compound layer comprises:
a light emitting layer; and
an electron injection layer in contact with the cathode,
wherein the electron injection layer comprises the lithium complex compound and another compound.

5. The apparatus according to claim 1, wherein the organic compound layer in contact with a cathode comprises one of an electron injecting layer and an electron transport layer.

6. The apparatus according to claim 1, wherein the organic compound layer in contact with one of the pair of electrodes contacts an organic compound layer other than a light emitting layer in the organic compound layer and does not contact the light emitting layer.

7. The apparatus according to claim 1, wherein $R_1$ to $R_6$ each represent a hydrogen atom.

8. The apparatus according to claim 1 further comprising:
a switching element connected to the organic light emitting element.

9. The apparatus according to claim 1 further comprising:
a display portion configured to display an image; and
an input portion configured to input image information.

10. The apparatus according to claim 1 further comprising:
a switching element connected to the organic light emitting element,
wherein a channel portion of the switching element contains an oxide semiconductor.

11. The apparatus according to claim 1 further comprising:
a photosensitive member; and
an exposing apparatus exposing the photosensitive member,
wherein the exposing apparatus comprises the organic light emitting element.

* * * * *